United States Patent
Yu et al.

(10) Patent No.: US 11,948,971 B2
(45) Date of Patent: Apr. 2, 2024

(54) CONFINED SOURCE/DRAIN EPITAXY REGIONS AND METHOD FORMING SAME

(71) Applicant: Taiwan Semiconductor Manufacturing Co., Ltd., Hsinchu (TW)

(72) Inventors: Jeng-Wei Yu, New Taipei (TW); Tsz-Mei Kwok, Hsinchu (TW); Tsung-Hsi Yang, Zhubei (TW); Li-Wei Chou, Hsinchu (TW); Ming-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 17/398,741

(22) Filed: Aug. 10, 2021

(65) Prior Publication Data

US 2021/0376073 A1 Dec. 2, 2021

Related U.S. Application Data

(62) Division of application No. 16/458,637, filed on Jul. 1, 2019, now Pat. No. 11,101,347.

(Continued)

(51) Int. Cl.
*H01L 29/06* (2006.01)
*H01L 29/66* (2006.01)
(Continued)

(52) U.S. Cl.
CPC .... *H01L 29/0649* (2013.01); *H01L 29/66795* (2013.01); *H01L 29/785* (2013.01); *H01L 29/78651* (2013.01)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,141,856 B2 11/2006 Lee et al.
7,534,686 B2 5/2009 Lee et al.
(Continued)

FOREIGN PATENT DOCUMENTS

CN 106252233 A 12/2016
CN 107665862 A 2/2018
(Continued)

*Primary Examiner* — Shaun M Campbell
(74) *Attorney, Agent, or Firm* — Slater Matsil, LLP

(57) ABSTRACT

A method includes forming isolations extending into a semiconductor substrate, recessing the isolation regions, wherein a semiconductor region between the isolation regions forms a semiconductor fin, forming a first dielectric layer on the isolation regions and the semiconductor fin, forming a second dielectric layer over the first dielectric layer, planarizing the second dielectric layer and the first dielectric layer, and recessing the first dielectric layer. A portion of the second dielectric layer protrudes higher than remaining portions of the first dielectric layer to form a protruding dielectric fin. A portion of the semiconductor fin protrudes higher than the remaining portions of the first dielectric layer to form a protruding semiconductor fin. A portion of the protruding semiconductor fin is recessed to form a recess, from which an epitaxy semiconductor region is grown. The epitaxy semiconductor region expands laterally to contact a sidewall of the protruding dielectric fin.

20 Claims, 20 Drawing Sheets

US 11,948,971 B2
Page 2

Related U.S. Application Data

(60) Provisional application No. 62/773,013, filed on Nov. 29, 2018.

(51) Int. Cl.
*H01L 29/78* (2006.01)
*H01L 29/786* (2006.01)

(58) Field of Classification Search
CPC ......... H01L 27/10826; H01L 27/10879; H01L 27/1211; H01L 29/0649; H01L 29/66795; H01L 29/785; H01L 29/78651
See application file for complete search history.

(56) References Cited

U.S. PATENT DOCUMENTS

| | | |
|---|---|---|
| 7,667,271 B2 | 2/2010 | Yu et al. |
| 8,263,451 B2 | 9/2012 | Su et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,093 B1 | 8/2014 | Cheng et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,878,309 B1 | 11/2014 | Hong et al. |
| 9,029,226 B2 | 5/2015 | Tsai et al. |
| 9,318,581 B1 * | 4/2016 | Guo ................ H01L 21/823821 |
| 9,564,353 B2 | 2/2017 | Huang et al. |
| 9,831,345 B2 | 11/2017 | Yu et al. |
| 10,297,690 B2 | 5/2019 | Li et al. |
| 10,424,657 B2 | 9/2019 | Xie et al. |
| 10,644,154 B2 | 5/2020 | Ching et al. |
| 10,692,983 B2 | 6/2020 | Li et al. |
| 10,777,664 B2 | 9/2020 | Hung et al. |
| 10,872,893 B2 | 12/2020 | Yang et al. |
| 10,910,223 B2 | 2/2021 | Liao et al. |
| 10,985,184 B2 | 4/2021 | Giles et al. |
| 11,004,724 B2 | 5/2021 | Lee et al. |
| 11,063,559 B2 | 7/2021 | Chen et al. |
| 11,205,713 B2 | 12/2021 | Lin et al. |
| 2005/0035391 A1 | 2/2005 | Lee et al. |
| 2011/0068407 A1 | 3/2011 | Yeh et al. |
| 2013/0011983 A1 | 1/2013 | Tsai et al. |
| 2014/0131776 A1 | 5/2014 | Ching et al. |
| 2014/0252412 A1 | 9/2014 | Tsai et al. |
| 2014/0252489 A1 | 9/2014 | Yu et al. |
| 2015/0357190 A1 | 12/2015 | Chien et al. |
| 2016/0111527 A1 | 4/2016 | Chien et al. |
| 2016/0268434 A1 * | 9/2016 | Ching ................. H01L 29/0847 |
| 2016/0358912 A1 | 12/2016 | Chen et al. |
| 2017/0077222 A1 * | 3/2017 | Lee .................... H01L 29/0649 |
| 2017/0084714 A1 * | 3/2017 | Ching ............... H01L 29/66795 |
| 2017/0323965 A1 | 11/2017 | Hattendorf et al. |
| 2018/0151440 A1 * | 5/2018 | Liao .................... H01L 29/0649 |
| 2018/0190810 A1 * | 7/2018 | Li ....................... H01L 29/0847 |
| 2020/0105869 A1 * | 4/2020 | Loubet ............... H01L 29/7851 |

FOREIGN PATENT DOCUMENTS

| | | |
|---|---|---|
| CN | 108122775 A | 6/2018 |
| CN | 108172548 A | 6/2018 |
| CN | 108269850 A | 7/2018 |
| IN | 1581431 A | 2/2005 |
| KR | 20050017584 A | 2/2005 |
| KR | 20140101259 A | 8/2014 |
| KR | 20140112363 A | 9/2014 |
| KR | 101782021 B1 | 2/2017 |
| TW | I593101 B | 7/2017 |
| TW | I594419 B | 8/2017 |
| TW | I608547 B | 12/2017 |
| TW | I623043 B | 5/2018 |
| TW | I623978 B | 5/2018 |
| TW | I625795 B | 6/2018 |
| TW | I641031 B | 11/2018 |

* cited by examiner

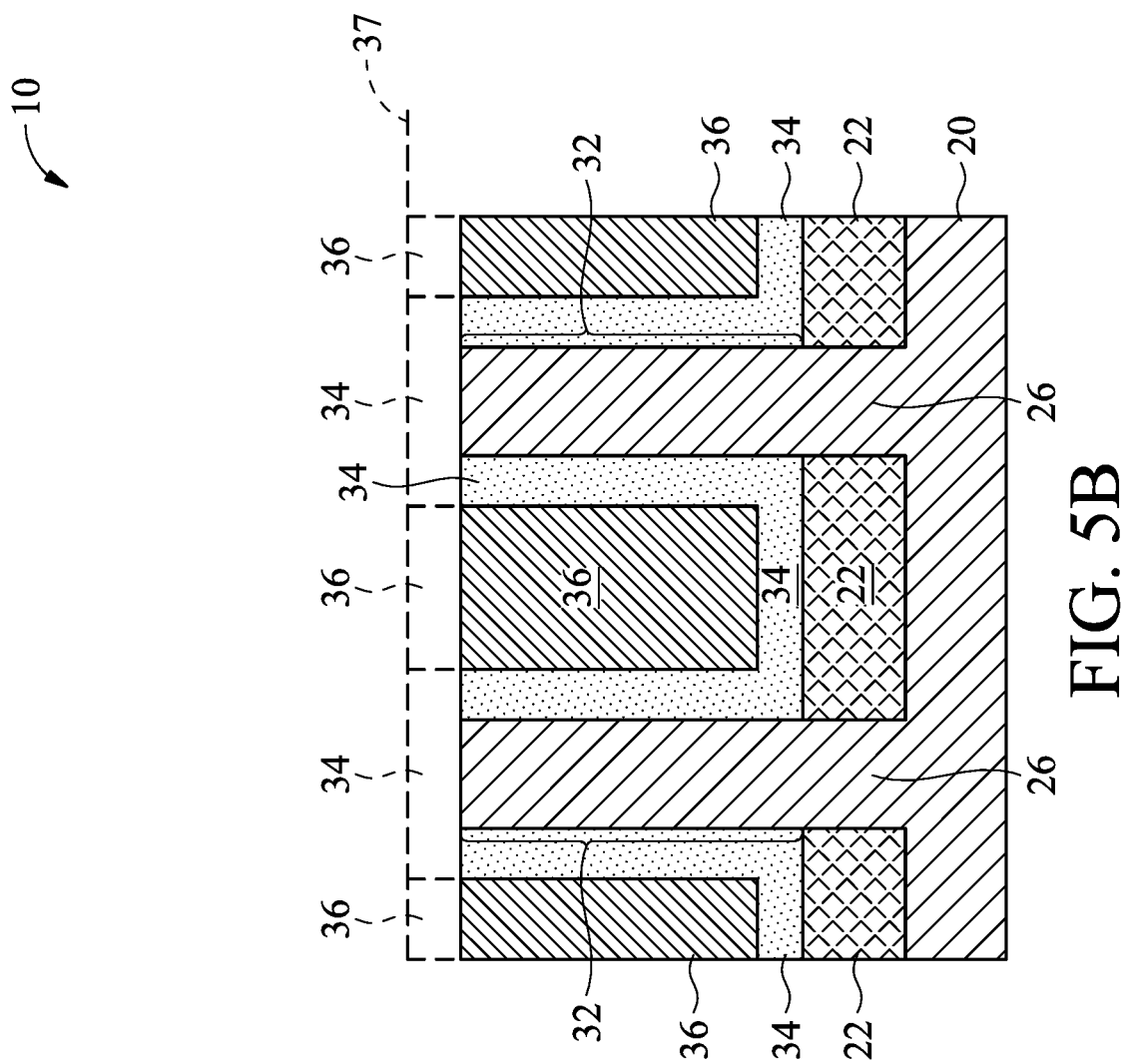

CONFINED SOURCE/DRAIN EPITAXY REGIONS AND METHOD FORMING SAME

PRIORITY CLAIM AND CROSS-REFERENCE

This application is a divisional of the U.S. patent application Ser. No. 16/458,637, entitled "Confined Source/Drain Epitaxy Regions and Method Forming Same," filed Jul. 1, 2019 which claims the benefit of the U.S. Provisional Application No. 62/773,013, filed Nov. 29, 2018, and entitled "Confined Source/Drain Epitaxy Growth Along Sidewall Dielectric," which applications are hereby incorporated herein by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, they have not been entirely satisfactory in all respects. For example, the FinFETs for different circuits such as core (logic) circuits and Static Random Access Memory (SRAM) circuits may have different designs, and the source/drain epitaxy regions grown from neighboring fins may need to be merged for some circuits (such as logic circuits), and need to be separated from each other for other circuits (such as SRAM circuits). However, to save manufacturing cost, different epitaxy regions are performed simultaneously. This causes difficulty for selectively making epitaxy regions merged for some circuits, and not merged for other circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 7C, 8, 9, 10A and 10B illustrate the perspective views and cross-sectional views of intermediate stages in the formation of Fin Field-Effect Transistors (FinFETs) in accordance with some embodiments.

DETAILED DESCRIPTION

Figure 1:
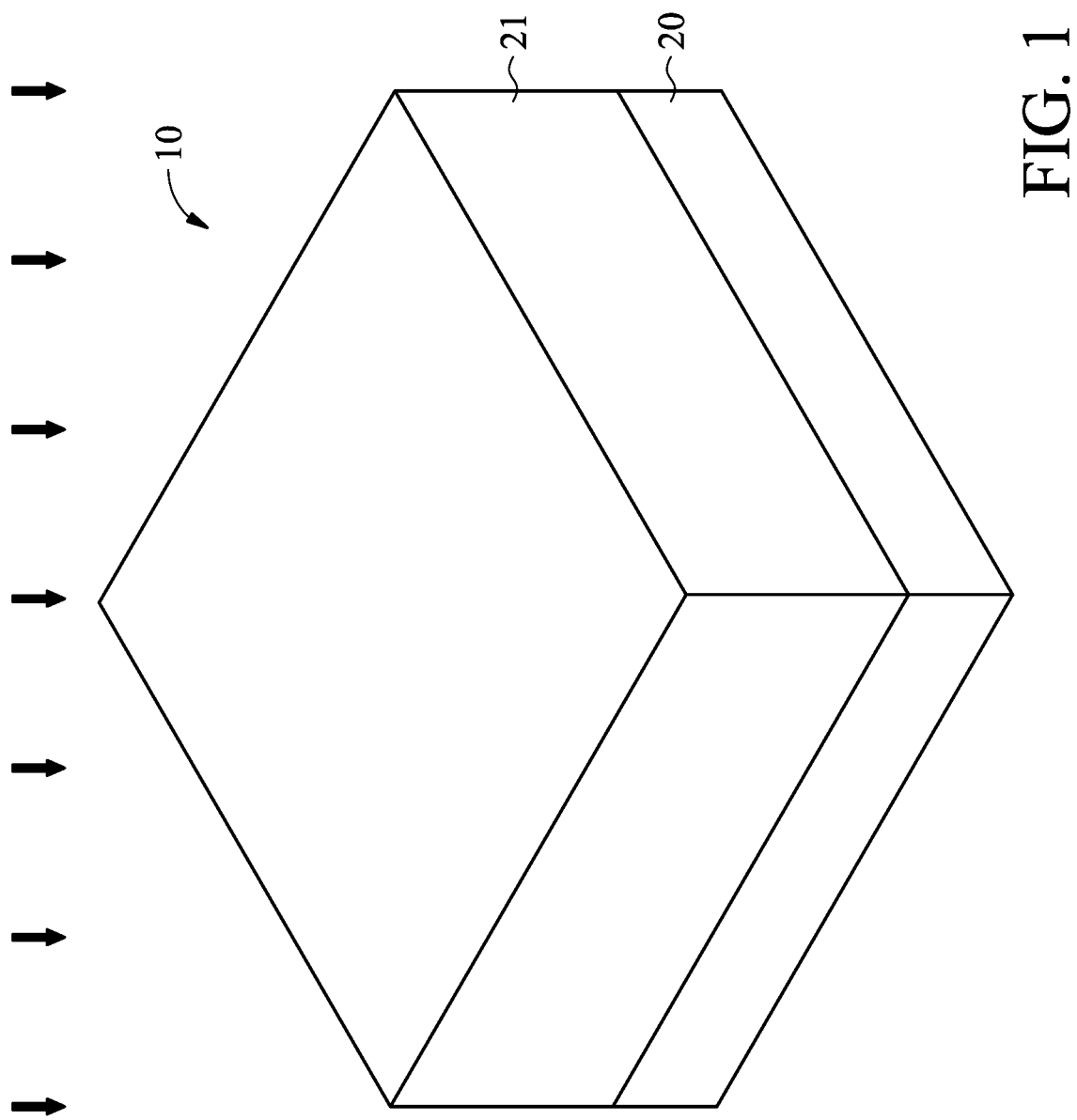

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with confined source/drain regions and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure. In accordance with some embodiments of the present disclosure, dielectric fins are formed on the top of Shallow Trench Isolation (STI) regions to define the spaces, in which epitaxy source/drain regions are grown. Accordingly, the lateral growth of the source/drain regions are limited by the dielectric fins, and neighboring epitaxy source/drain regions do not suffer from the risk of merging (bridging) when not intended.

Figure 15:
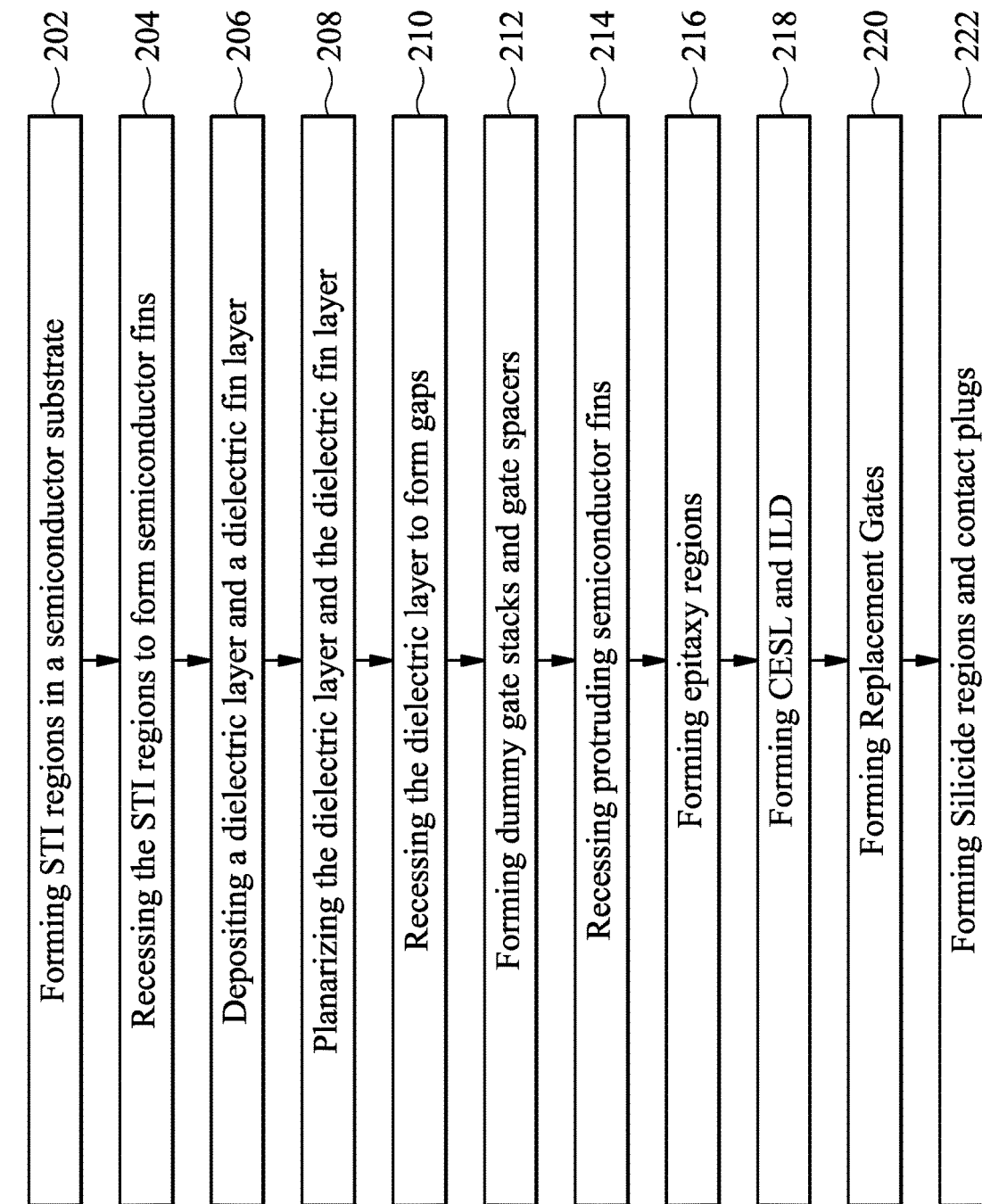
FIG. 15 illustrates a process flow for forming a FinFET in accordance with some embodiments.

FIGS. 1-4, 5A, 5B, 6A, 6B, 7A, 7B, 7C, 8, 9, 10A and 10B illustrate the cross-sectional views and perspective views of intermediate stages in the formation of a Fin Field-Effect Transistor (FinFET) in accordance with some embodiments of the present disclosure. The processes shown in these figures are also reflected schematically in the process flow 200 shown in FIG. 15.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 21 is formed in substrate 20. In accordance with some embodiments of the present disclosure, well region 21 is an n-type well region formed through implanting an n-type impurity, which may be phosphorus, arsenic, antimony, or the like, into substrate 20. In accordance with other embodiments of the present disclosure, well region 21 is a p-type well region formed through implanting a p-type impurity, which may be boron, indium, or the like, into substrate 20. The resulting well region 21 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
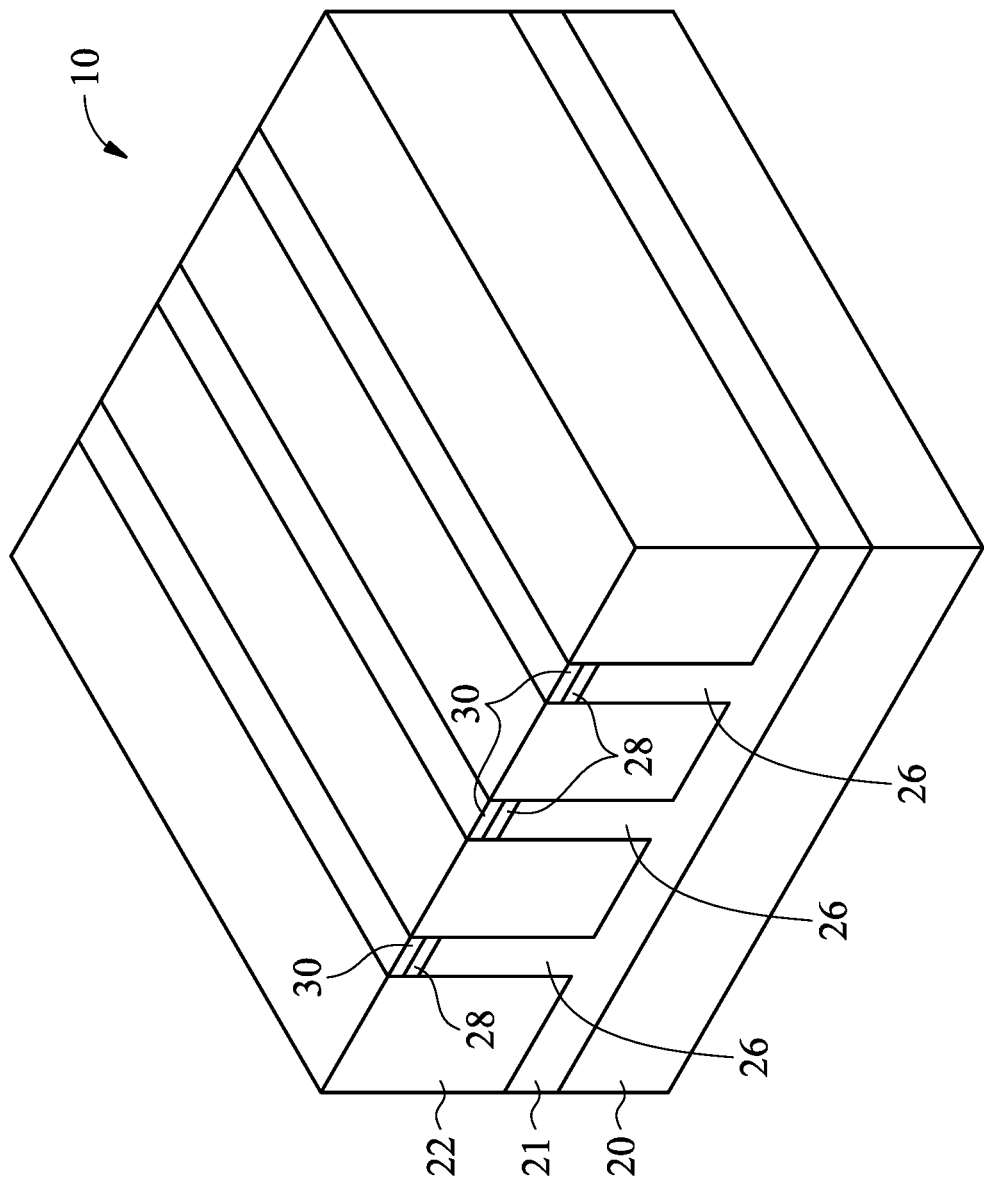

Referring to FIG. 2, isolation regions 22 are formed to extend from a top surface of substrate 20 into substrate 20. The respective process is illustrated as process 202 in the process flow 200 shown in FIG. 15. Isolation regions 22 are alternatively referred to as Shallow Trench Isolation (STI) regions hereinafter. The portions of substrate 20 between neighboring STI regions 22 are referred to as semiconductor strips 26. To form STI regions 22, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 22. STI regions 22 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 22 may be substantially level with each other. Semiconductor strips 26 are between neighboring STI regions 22. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 22 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
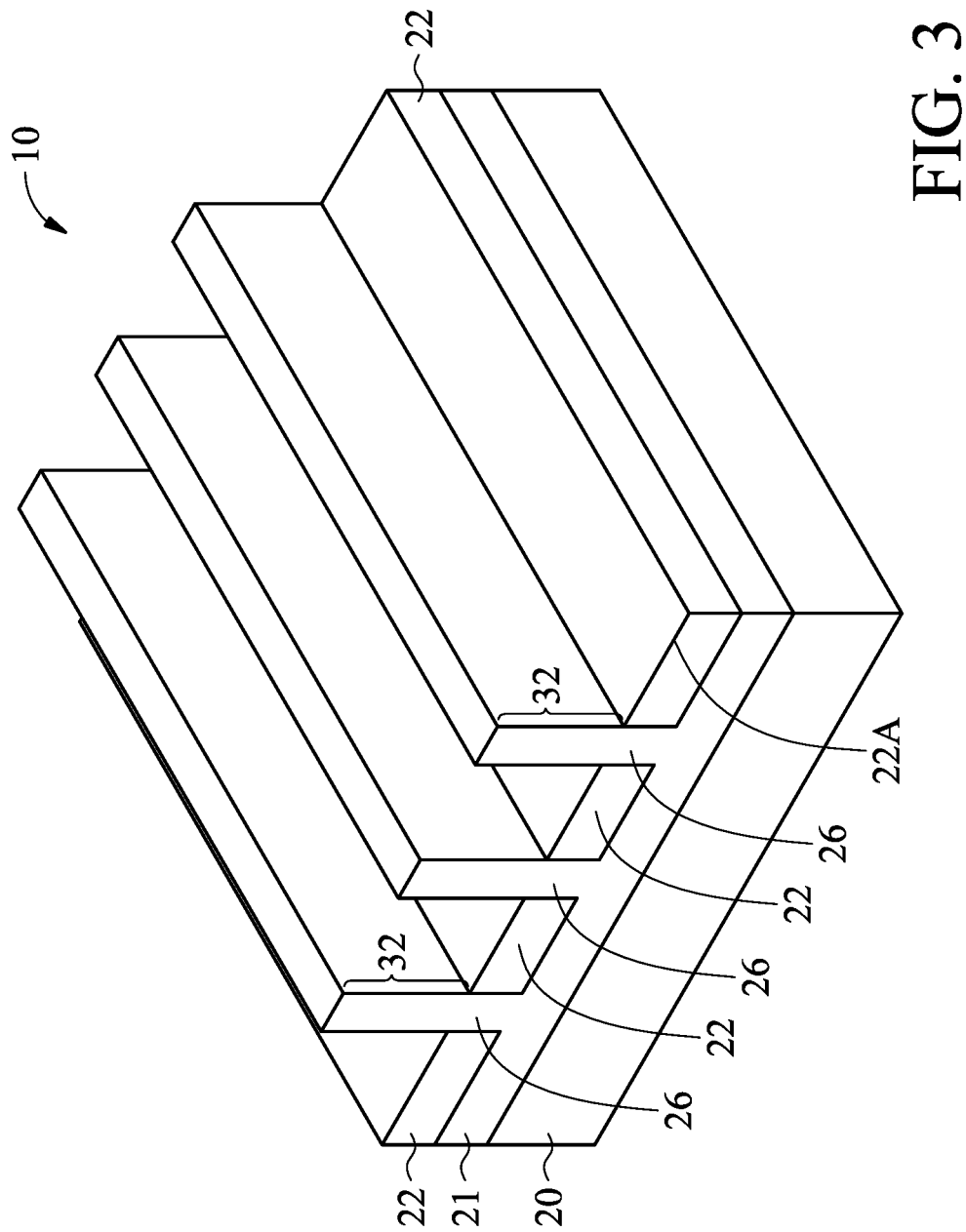

Referring to FIG. 3, STI regions 22 are recessed, so that the top portions of semiconductor strips 26 protrude higher than the top surfaces 22A of the remaining portions of STI regions 22 to form protruding fins 32. The respective process is illustrated as process 204 in the process flow 200 shown in FIG. 15. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
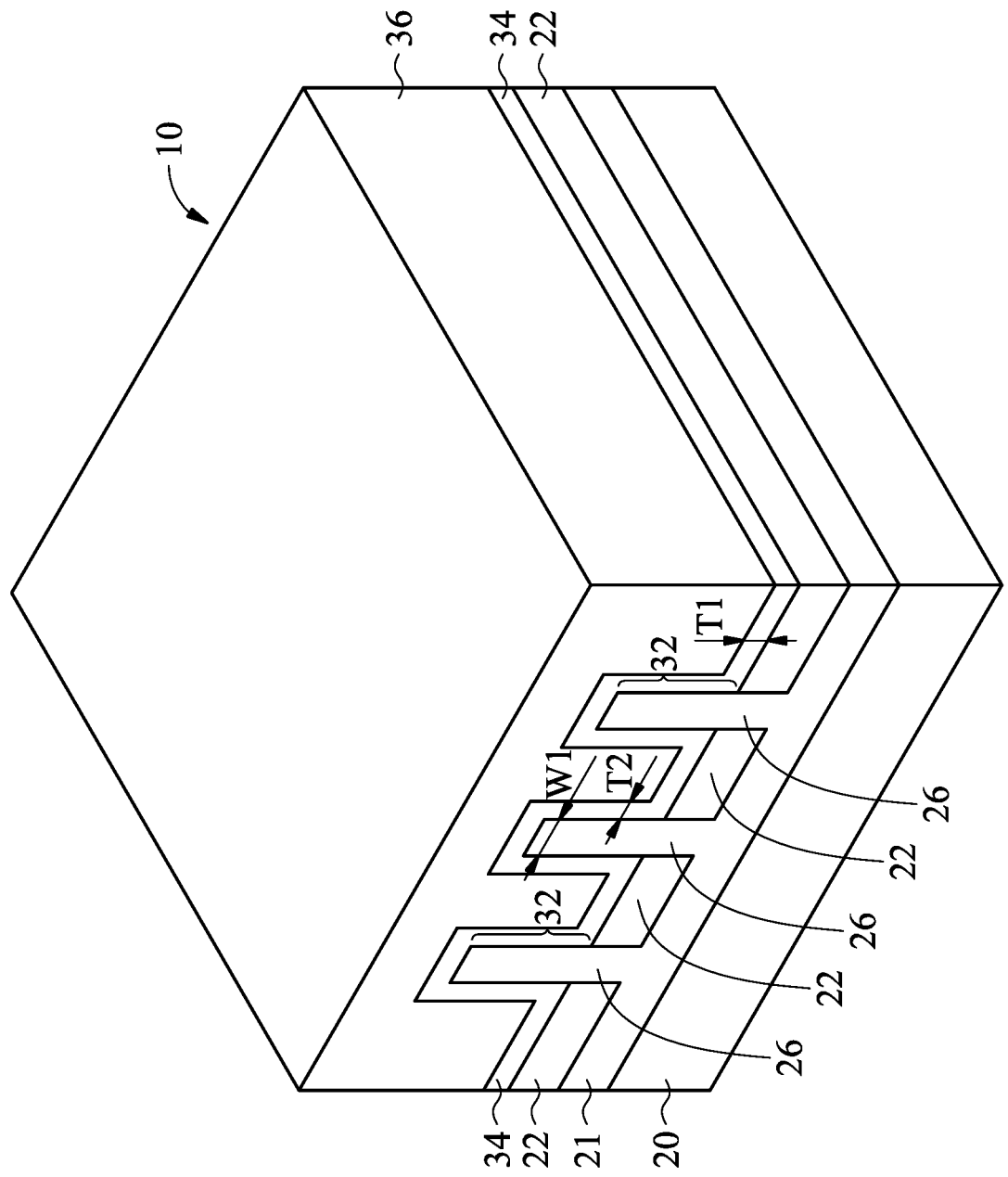

Referring to FIG. 4, dielectric layer 34 is formed. The respective process is illustrated as process 206 in the process flow 200 shown in FIG. 15. In accordance with some embodiments of the present disclosure, dielectric layer 34 is formed using a conformal deposition method such as Atomic Layer Deposition (ALD) or CVD. Accordingly, the thickness T1 of the horizontal portions and thickness T2 of the vertical portions of dielectric layer 34 are equal to or substantially equal to each other, for example, with a variation smaller than about 10 percent. The material of dielectric layer 34 may be selected from silicon oxide, silicon nitride, silicon oxynitride, silicon oxy-carbo-nitride, hafnium oxide, zirconium oxide, aluminum oxide, and the like. The thickness T2 (and T1) of dielectric layer 34 may be greater than about 5 nm, and may be in the range between about 5 nm and about 25 nm. Furthermore, thickness T2 (and T1) may be comparable with width W1 of protruding fins 32, for example, with ratio T1/W1 in the range between about 1 and about 7.

Dielectric layer 34 may be formed of the same material as, or a different material than, the material of the underlying STI regions 22. Also, since the method of forming dielectric layer 34 (for example, ALD or CVD) and the method of forming STI regions 22 (for example, FCVD) may be different from each other, the properties (such as densities) of dielectric layer 34 and STI regions 22 may be different from each other. In accordance with some embodiments of the present disclosure, dielectric layer 34 has a density greater than that of STI regions 22.

Dielectric fin layer 36 is then formed over dielectric layer 34. The respective process is also illustrated as process 206 in the process flow 200 shown in FIG. 15. Dielectric fin layer 36 is formed using a method that has good gap-filling capability. In accordance with some embodiments of the present disclosure, dielectric fin layer 36 is formed through High-density Plasma Chemical Vapor Deposition (HDPCVD), PECVD, ALD, or the like. The material of dielectric fin layer 36 is different from the material of dielectric layer 34. The material of dielectric fin layer 36 may also be selected from the same group of candidate materials as that of dielectric layer 34, which candidate materials include, and are not limited to, silicon oxide, silicon nitride, silicon oxynitride, silicon oxy-carbo-nitride, hafnium oxide, zirconium oxide, aluminum oxide, and the like. Dielectric fin layer 36 fully fills the gap between neighboring protruding portions of dielectric layer 34.

Figure 5A:
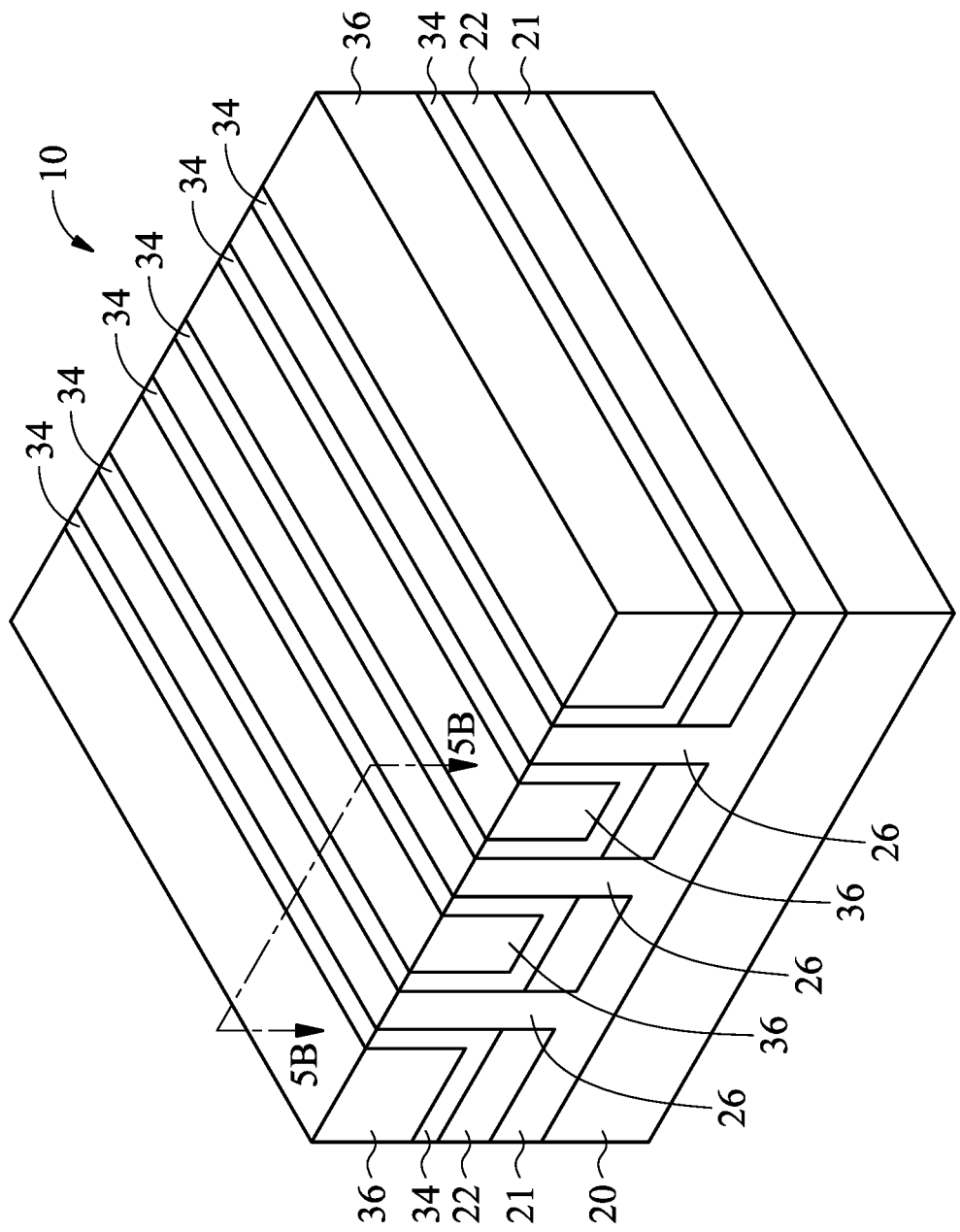

Next, referring to FIG. 5A, a planarization process such as a CMP process or a mechanical grinding process is performed, so that the top portions of dielectric fin layer 36 and dielectric layer 34 are removed, and the top surfaces of protruding fins 32 are exposed. The respective process is illustrated as process 208 in the process flow 200 shown in FIG. 15. In accordance with alternative embodiments of the present disclosure, the planarization process is performed using dielectric layer 34 as a (CMP/polishing) stop layer, so that when the planarization process is finished, the horizontal portions of dielectric layer 34 over the top surfaces of protruding fins 32 still have some portions remain.

FIG. 5B illustrates the reference cross-section 5B-5B in FIG. 5A, wherein the reference cross-section is obtained in a vertical plane. When dielectric layer 34 is used as the stop layer in the planarization process, the top surface of wafer 10 may be at the level show by dashed line 37. Accordingly, some portions of dielectric layer 34 and dielectric fin layer 36, as represented by dashed lines, may remain.

Figure 6A:
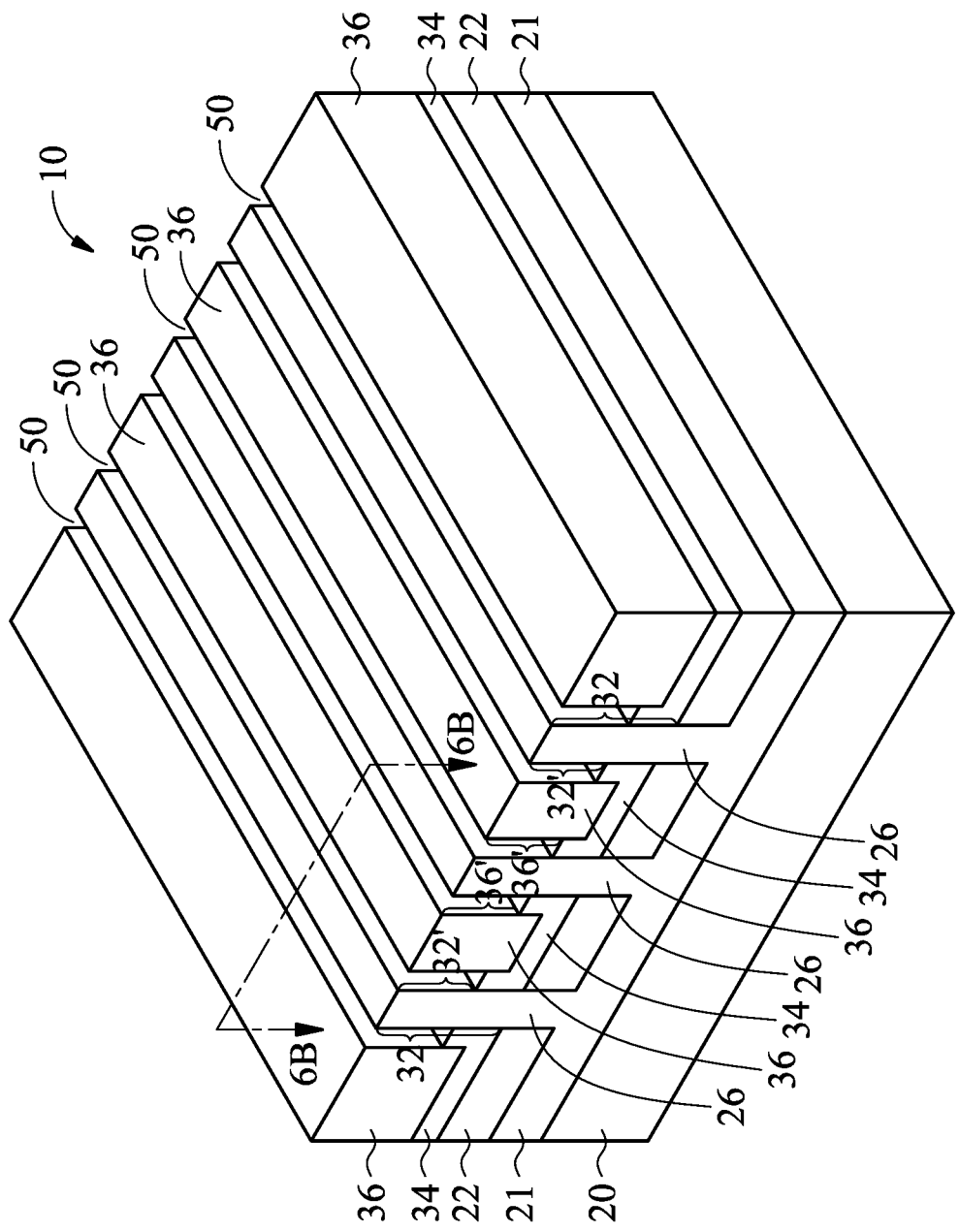
Figure 6B:
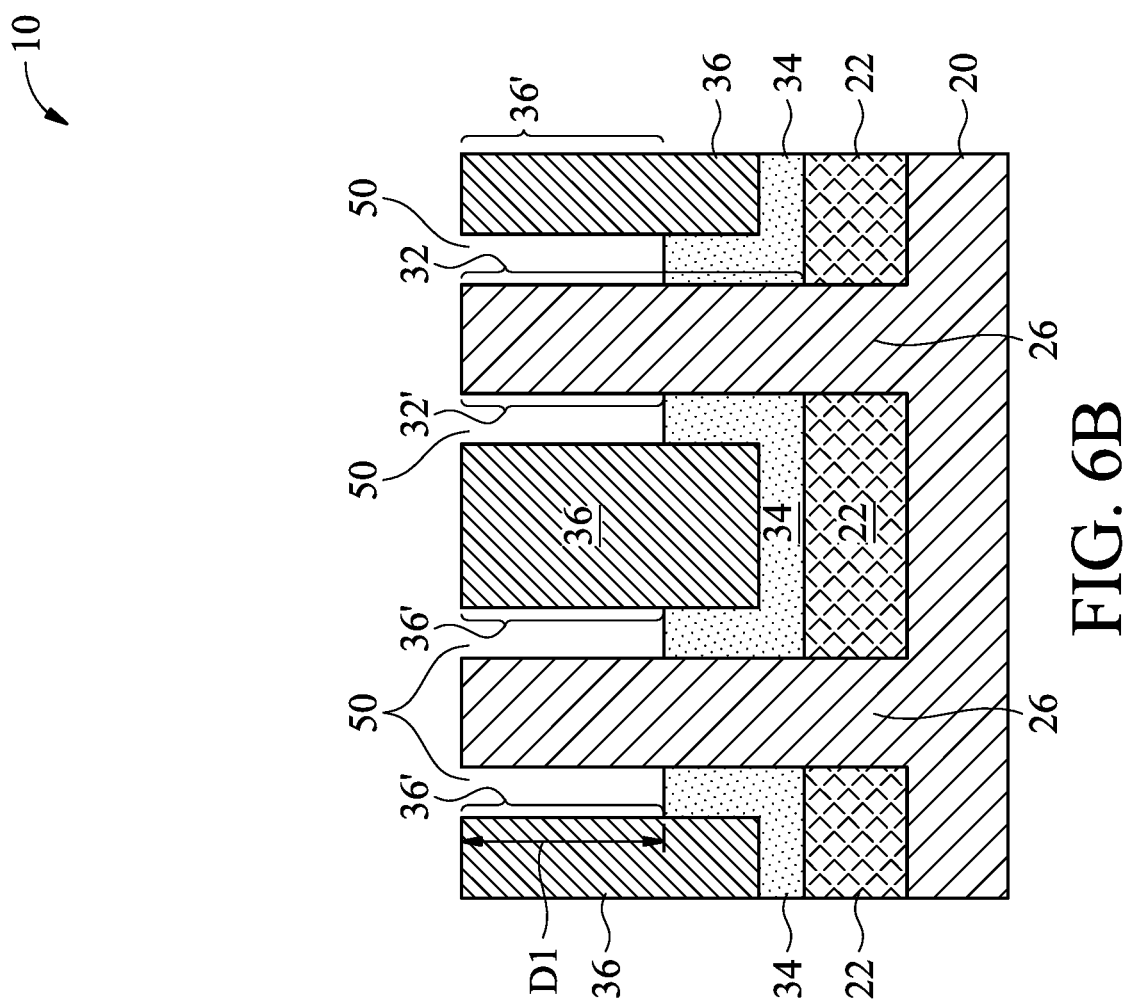

FIGS. 6A and 6B illustrate the recessing of dielectric layer 34. The respective process is illustrated as process 210 in the process flow 200 shown in FIG. 15. The recessing may be performed using an isotropic etching process (such as a wet etching process or a dry etching process) or an anisotropic etching process (such as a dry etching process). The etching chemical (etching solution or etching gas) is selected depending on the materials of dielectric layer 34 and dielectric fin layer 36, and is selected so that dielectric layer 34 is etched, while dielectric fin layer 36 is not etched. As a result of the recessing of dielectric layer 34, some portions of dielectric fin layer 36 protrude higher than the top surfaces of the remaining dielectric layer 34 to form dielectric fins 36'. Furthermore, semiconductor fins 32 have some portions protruding higher than the top surfaces of the remaining dielectric layer 34 to form protruding semiconductor fins 32'.

FIG. 6B illustrates the reference cross-section 6B-6B in FIG. 6A, wherein the reference cross-section is obtained in a vertical plane. In the cross-sectional view, dielectric layer 34 has a bottom portion underlying dielectric layer 36, and sidewall portions over and connected to the opposite ends of the bottom portion. The sidewall portions are recessed. Protruding semiconductor fins 32' and protruding dielectric fins 36' are separated from each other by gaps 50, which are left by the recessed dielectric layer 34. In accordance with some embodiments of the present disclosure, depth D1 of gaps 50, which are also the heights of protruding semiconductor fins 32' and/or protruding dielectric fins 36', is in the range between about 35 nm and about 80 nm.

Figure 7A:
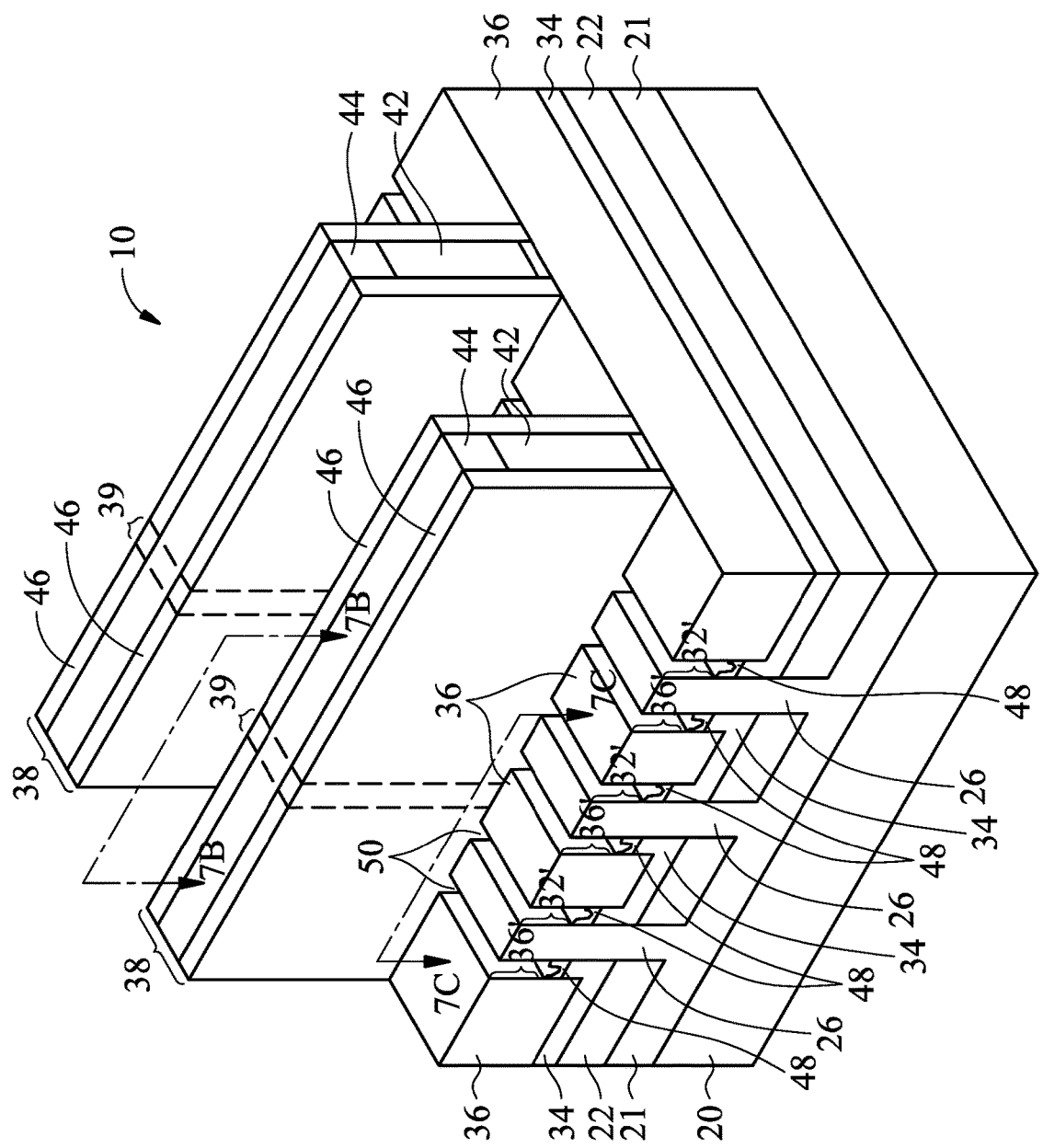

Referring to FIG. 7A, dummy gate stacks 38 are formed to extend on the top surfaces and the sidewalls of protruding semiconductor fins 32' and protruding dielectric fins 36'. The respective process is illustrated as process 212 in the process flow 200 shown in FIG. 15. Dummy gate stacks 38 may include dummy gate dielectrics 40 and dummy gate electrodes 42 over dummy gate dielectrics 40. Dummy gate dielectrics 40 may be formed of silicon oxide, and dummy gate electrodes 42 may be formed of amorphous silicon or polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding semiconductor fins 32' and one or a plurality of protruding dielectric fins 36'. Dummy gate stacks 38 also have lengthwise directions perpendicular to the lengthwise directions of protruding semiconductor fins 32' and protruding dielectric fins 36'.

FIG. 7A schematically illustrates regions 39, which may have gate stacks 38 and gate spacers 46 formed therein, or may be breaks that separate the neighboring dummy gate stacks 38. When regions 39 are breaks, the dummy gate stacks 38 on the left side of the breaks 39 and the dummy gate stacks 38 on the right side of the breaks 39 are separate dummy gate stacks. As a result, the portions of dummy gate stacks 38 on the left side of the breaks 39 may be used to form a first FinFET, and the dummy gate stacks 38 on the right side of the breaks 39 may be used for form a second FinFET. Alternatively, gate stacks 38 and gate spacers 46 are also formed in regions 39 as parts of a continuous dummy gate stack 38 and continuous gate spacers 46.

Figure 7B:
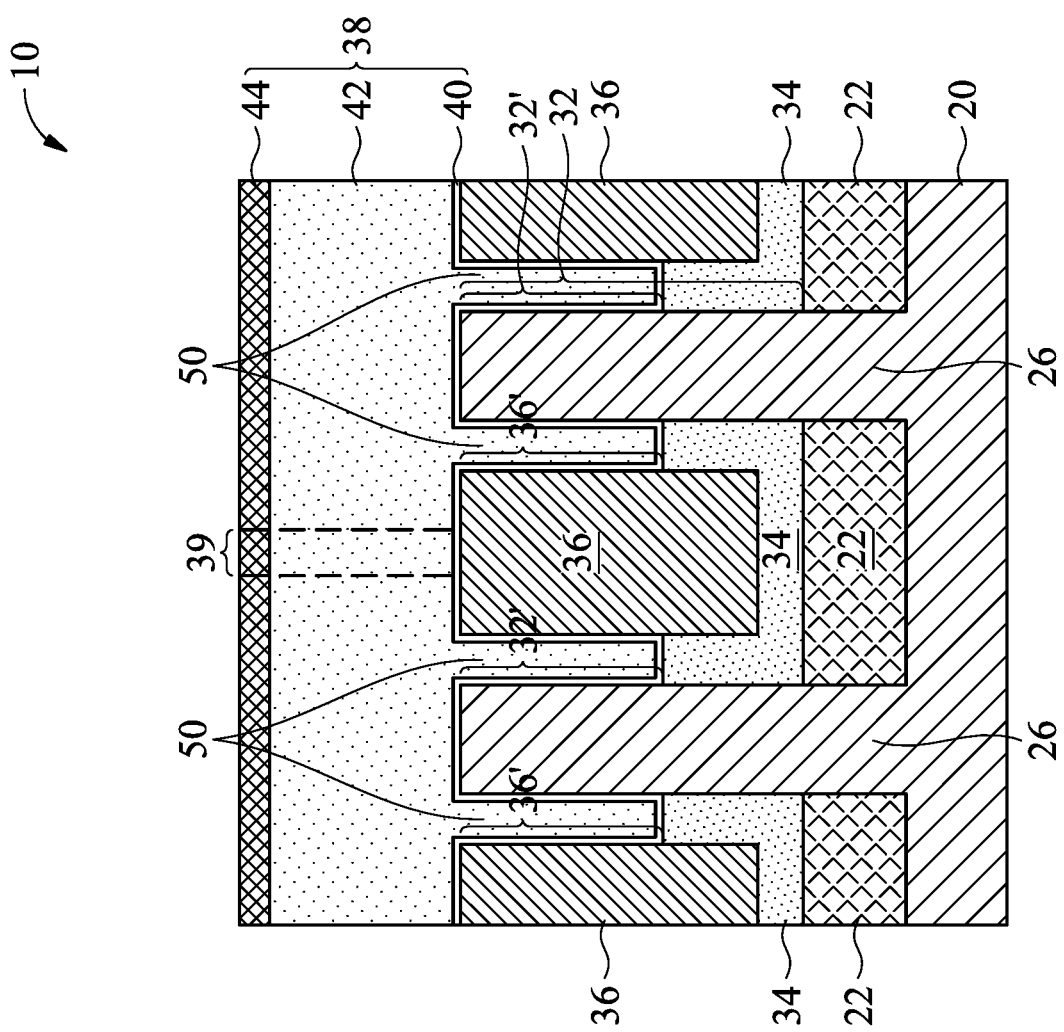

FIG. 7B illustrates the reference cross-section 7B-7B in FIG. 7A, wherein the reference cross-section is obtained in a vertical plane. As shown in FIG. 7B, dummy gate electrodes layer 40 and dummy gate dielectric 42 may extend into the gaps 50 between neighboring protruding semiconductor fins 32' and protruding dielectric fins 36'.

Further referring to FIG. 7A, gate spacers 46 are formed on the sidewalls of dummy gate stacks 38. The respective process is also illustrated as process 212 in the process flow 200 shown in FIG. 15. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers. In accordance with some embodiments of the present disclosure, the formation of gate spacers 46 includes depositing a conformal spacer layer (which may be a single layer or a composite layer, not shown) on wafer 10, and then performing an anisotropic etching process to remove the horizontal portions of the spacer layer. The spacer layer is formed on the top surfaces and the sidewalls of dummy gate stacks 38, protruding semiconductor fins 32', and protruding dielectric fins 36'. Gate spacers 46 also have some portions extending into the gaps 50. At the same time gate spacers 46 (FIG. 7A) are formed through etching the spacer layer, fin spacers 48 are also formed, as shown in FIGS. 7A and 7C.

Figure 7C:
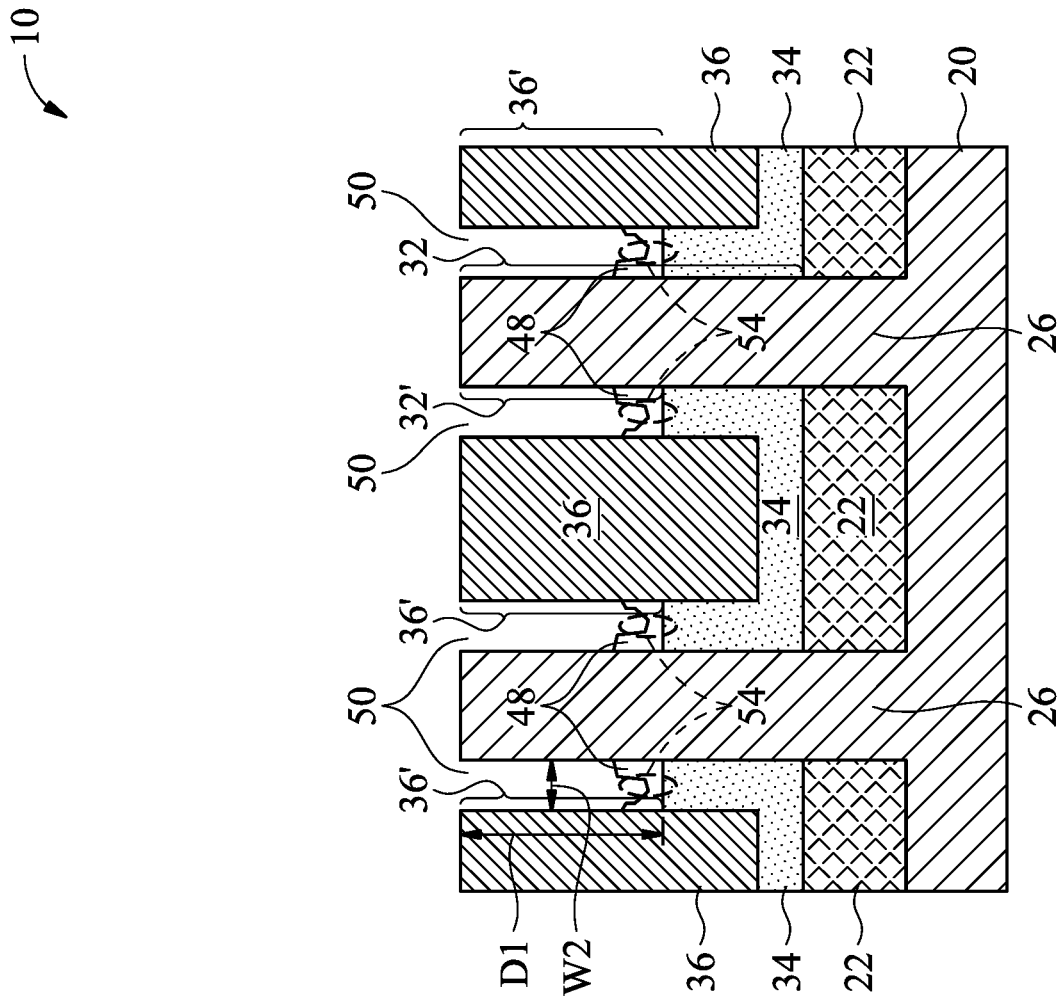

FIG. 7C illustrates the reference cross-section 7C-7C in FIG. 7A, wherein the reference cross-section is obtained in a vertical plane. In accordance with some embodiments of the present disclosure, the fin spacer 48 on the sidewall of protruding semiconductor fins 32' may be continuously connected to the respective fin spacer 48 on the sidewall of protruding dielectric fins 36'. This is caused by the reduced etching rate of the portions of spacer layer in gaps 50 than the portions outside of gaps 50. In accordance with alternative embodiments of the present disclosure, the fin spacers 48 on the sidewalls of protruding semiconductor fins 32' are separated from the fin spacers 48 on the sidewalls of protruding dielectric fins 36'. Accordingly, the portions of fin spacers 48 in dashed regions 54 may or may not exist. Whether the portions of fin spacers 48 in dashed regions 54 are removed or not is related to the aspect ratio and the width W2 of gaps 50, and the smaller the aspect ratio and/or the greater the width W2, the more likely the portions of fin spacers 48 in dashed regions 54 will be removed.

Figure 8:
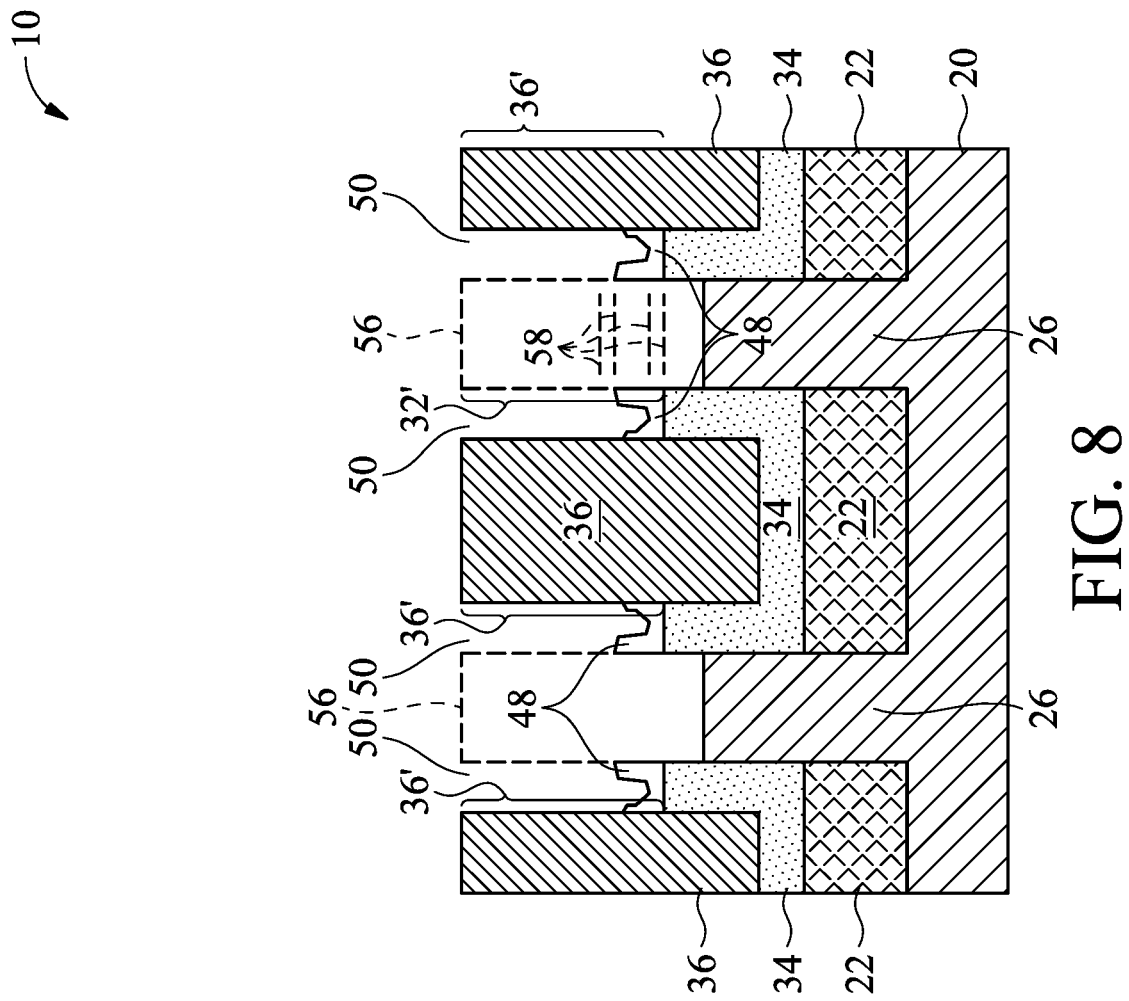

An etching process is then performed to etch the portions of protruding semiconductor fins 32' that are not covered by dummy gate stacks 38 and gate spacers 46 (FIG. 7A), resulting in the structure shown in FIG. 8. The respective process is illustrated as process 214 in the process flow 200 shown in FIG. 15. FIG. 8 illustrates the reference cross-section same as the reference cross-section of FIG. 7C. The recessing may be anisotropic, and hence the portions of semiconductor fins 32'/32 directly underlying dummy gate stacks 38 and gate spacers 46 are protected, and are not etched. The top surfaces of the recessed protruding fins 32/32' may be high than, level with, or lower than the top surfaces of dielectric layers 34. For example, dashed lines 58 illustrate the possible positions of the top surfaces of remaining protruding semiconductor fins 32'/32. Recesses are formed on the opposite sides of dummy gate stacks 38 (as may be realized from FIG. 7A), and are located between the remaining portions of protruding semiconductor fins 32'/32.

Figure 9:
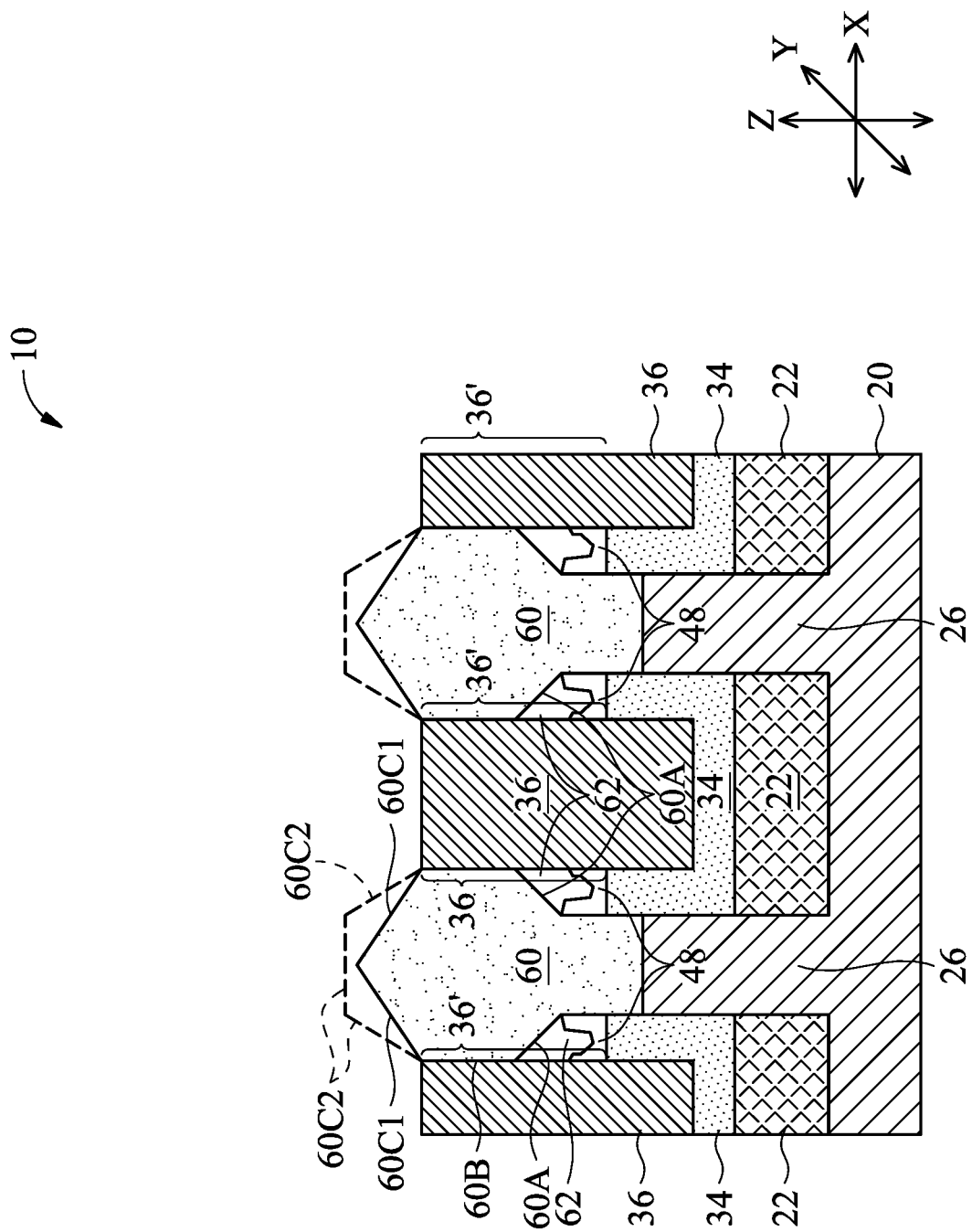

Next, epitaxy regions (source/drain regions) 60 are formed by selectively growing (through epitaxy) a semiconductor material in recesses 56, resulting in the structure in FIG. 9. The respective process is illustrated as process 216 in the process flow 200 shown in FIG. 15. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 60 comprise III-V compound semiconductors such as GaAs, InP, GaN, InGaAs, InAlAs, GaSb, AlSb, AlAs, AlP, GaP, combinations thereof, or multi-layers thereof. After epitaxy regions 60 are grown to the level higher than the top surfaces of fin spacer 48, there is no restriction in the lateral growth, and the further epitaxial growth of epitaxy regions 60 causes epitaxy regions 60 to expand horizontally, and facets 60A may be formed.

FIG. 9 illustrates two possible profiles of epitaxy regions 60. The top surfaces shown using solid lines have two slant top surfaces 60C1 merged together. The top surfaces 60C2 shown using dashed lines have two slant top surfaces joined to a substantially flat top surface.

Figure 11:
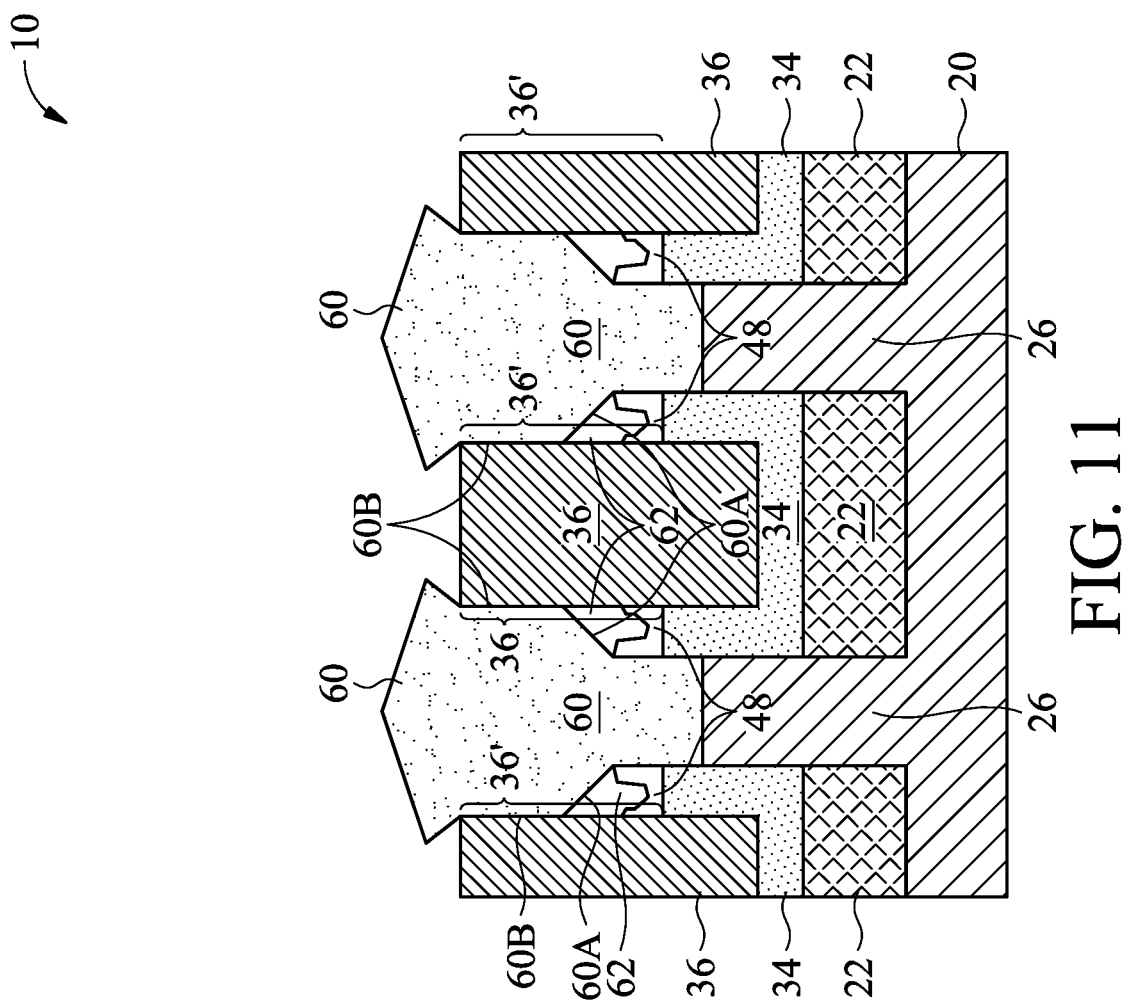
FIGS. 11 through 13 illustrate the cross-sectional views of intermediate stages in the formation of FinFETs in accordance with some embodiments.

When epitaxy regions 60 is laterally grown to contact protruding dielectric fins 36', the lateral growth is restricted/limited, and epitaxy regions 60 are grown vertically. In accordance with some embodiments of the present disclosure, the growth of epitaxy regions 60 is stopped before or when the side edges of epitaxy regions 60 reach the top surface level of protruding dielectric fins 36'. In accordance with alternative embodiments of the present disclosure, as shown in FIG. 11, the growth of epitaxy regions 60 is continued after the side edges 60B reach the top surface level of protruding dielectric fins 36', and epitaxy regions 60 further grow laterally.

Referring back to FIG. 9, due to the limitation of dielectric fins 36', edges 60B of epitaxy regions 60 are in contact with dielectric fins 36' to form interfaces, which are substantially vertical and straight in the cross-sectional view. Air gaps 62 are formed under facets 60A, and are defined by epitaxy regions 60, protruding dielectric fins 36', fin spacers 48, and possibly dielectric layer 34 (if the portions of fin spacers 48 in regions 54 (FIG. 7C) are removed). Air gaps 62 are sealed when the growth of epitaxy regions 60 is finished since the opposite ends (in the Y-direction) of air gaps 62 are sealed by gate spacers 48, as can be conceived from FIG. 7A. Dielectric fins 36' prevent neighboring epitaxy regions 60 from merging with each other, so that the lateral growth of epitaxy regions 60 is defined by protruding dielectric fins 36', and the epitaxy regions of neighboring FinFETs may be closer to each other without the concern of merging with each other.

After the epitaxy process, epitaxy regions 60 may be further implanted with a p-type or an n-type impurity to form source and drain regions, which are also denoted using reference numeral 60. In accordance with alternative embodiments of the present disclosure, the implantation process is skipped when epitaxy regions 60 are in-situ doped with the p-type or n-type impurity during the epitaxy.

Figure 10A:
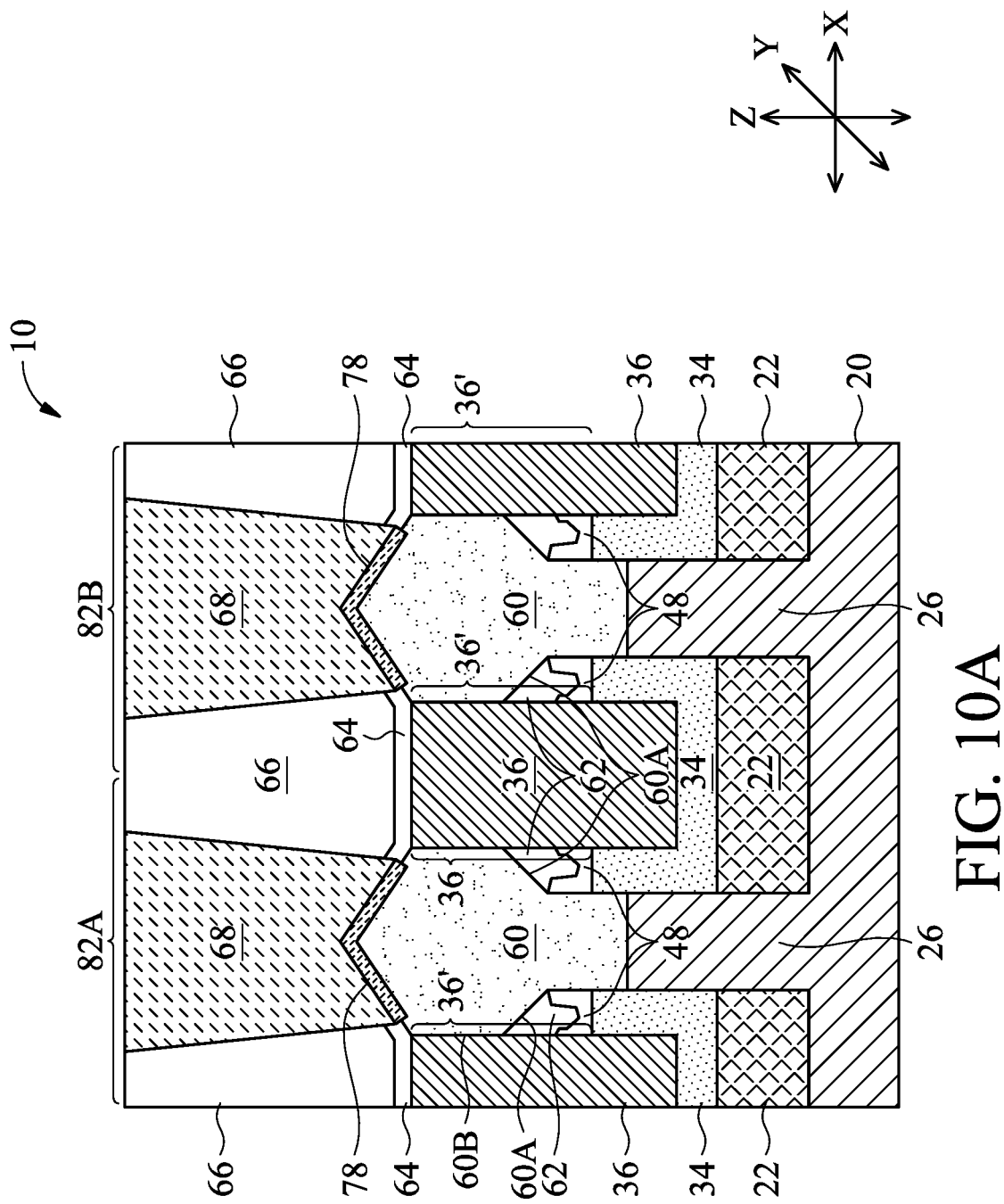

FIG. 10A illustrates a cross-sectional view of the structure after the formation of Contact Etch Stop Layer (CESL) 64 and Inter-Layer Dielectric (ILD) 66. The respective process is illustrated as process 218 in the process flow 200 shown in FIG. 15. CESL 64 may be formed of silicon oxide, silicon nitride, silicon carbo-nitride, or the like, and may be formed using CVD, ALD, or the like. ILD 66 may include a dielectric material formed using, for example, FCVD, spin-on coating, CVD, or the like deposition method. ILD 66 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 66, dummy gate stacks 38 (FIG. 7A), and gate spacers 46 with each other.

Figure 10B:
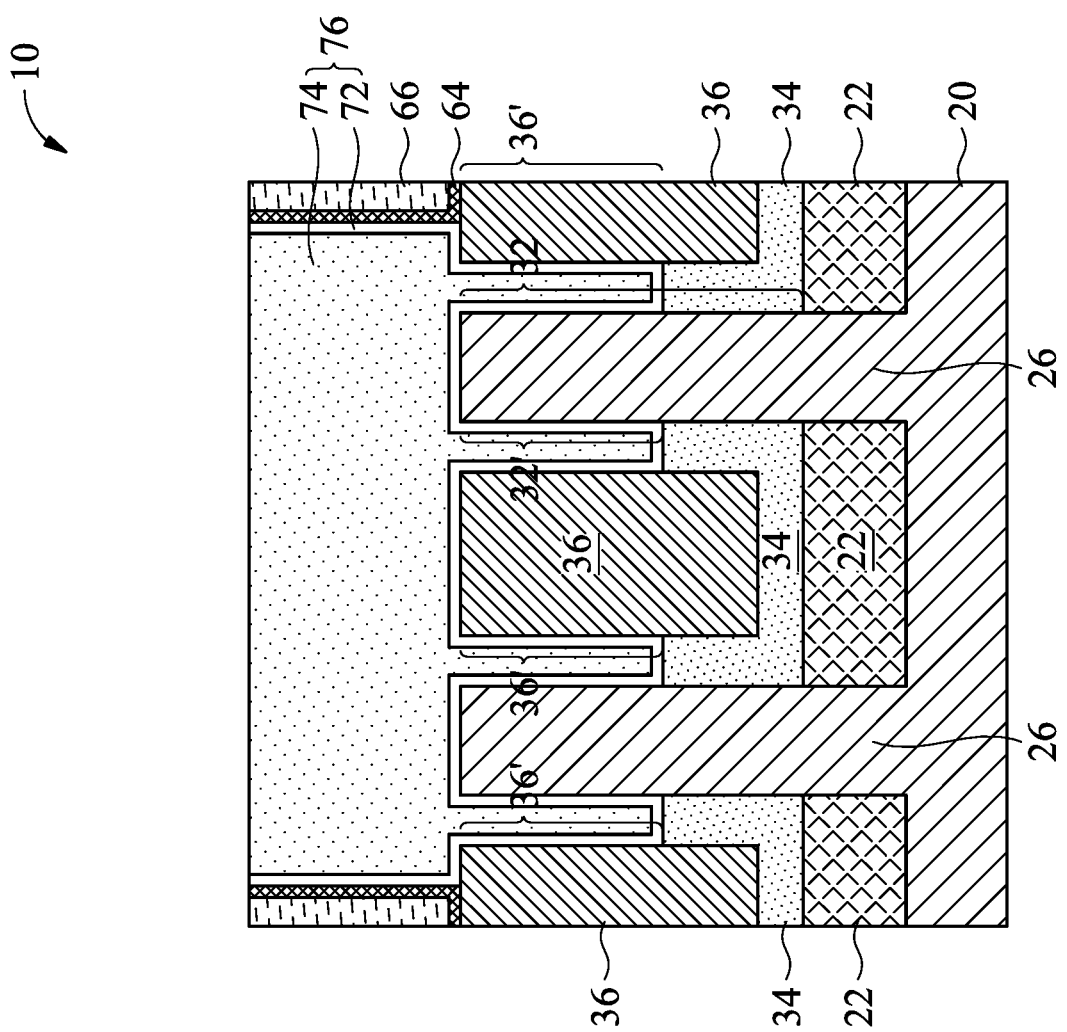

Next, the dummy gate stacks 38 as shown in FIG. 7B are replaced with replacement gate stacks 76, with one of replacement gate stacks 76 illustrated in FIG. 10B. The respective process is illustrated as process 220 in the process flow 200 shown in FIG. 15. The cross-sectional view shown in FIG. 10B is obtained from the same vertical plane as the vertical plane containing line 7B-7B in FIG. 7A. In the replacement process, the dummy gate stacks 38 including hard mask layers 44, dummy gate electrodes 42 and dummy gate dielectrics 40 (FIGS. 7A and 7B) are etched, forming trenches between gate spacers 46. The top surfaces and the sidewalls of protruding semiconductor fins 32' are exposed to the trenches. Next, as shown in FIG. 10B, replacement gate stacks 76 are formed in the trenches. Replacement gate stacks 76 include gate dielectrics 72 and gate electrodes 74.

In accordance with some embodiments of the present disclosure, a gate dielectric 72 includes an Interfacial Layer (IL) as its lower part. The IL is formed on the exposed surfaces of protruding semiconductor fins 32'. The IL may include an oxide layer such as a silicon oxide layer, which is formed through the thermal oxidation of protruding semiconductor fins 32', a chemical oxidation process, or a deposition process. Gate dielectric 72 may also include a high-k dielectric layer formed over the IL. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. The high-k dielectric layer is overlying, and may contact, the IL. The high-k dielectric layer is formed as a conformal layer. In accordance with some embodiments of the present disclosure, the high-k dielectric layer is formed using ALD, CVD, PECVD, Molecular-Beam Deposition (MBD), or the like.

Gate electrode 74 is formed on gate dielectric 72. Gate electrode 74 may include a plurality of metal-containing layers, which may be formed as conformal layers, and a filling-metal region filling the rest of the trenches unfilled by the plurality of metal-containing layers. The metal-containing layers may include a barrier layer, a work-function layer over the barrier layer, and one or a plurality of metal capping layers over the work-function layer.

FIG. 10A further illustrates the formation of silicide regions 78 and source/drain contact plugs 68. The respective process is illustrated as process 222 in the process flow 200 shown in FIG. 15. The cross-sectional view shown in FIG. 10A is obtained from the same vertical plane as the vertical plane containing line 7C-7C in FIG. 7A. The formation of source/drain contact plugs 68 includes etching ILD 66 to expose the underlying portions of CESL 64, and then etching the exposed portions of CESL 64 to reveal source/drain regions 60. In a subsequent process, a metal layer (such as a Ti layer) is deposited and extending into the contact openings. A metal nitride capping layer may be formed. An anneal process is then performed to react the metal layer with the top portions of source/drain regions 60 to form silicide regions 78, as shown in FIG. 10A. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 68. Gate contact plugs (not shown) are also formed over and contacting gate electrodes 74. FinFETs 82A and 82B (FIG. 10A) are thus formed. FinFETs 82A and 82B may be parts of the same FinFET that share a same replacement gate, or may be different FinFETs having different replacement gates.

In FIGS. 10A and 10B, dielectric layer 34 is over and in contact with the corresponding underlying portions of STI regions 22. Dielectric layer 34 is formed in a different formation process than the underlying portion of STI regions 22. The formation methods of dielectric layer 34 and STI regions 22 may be the same as or different from each other. Regardless of whether dielectric layer 34 is formed of a same material as that of the underlying isolation regions 22, there may be distinguishable interfaces therebetween. Also, the edges of dielectric layer 34 and the corresponding edges of STI regions 22 may be flush with each other, and may contact the same edges of semiconductor strip 26.

Figure 12:
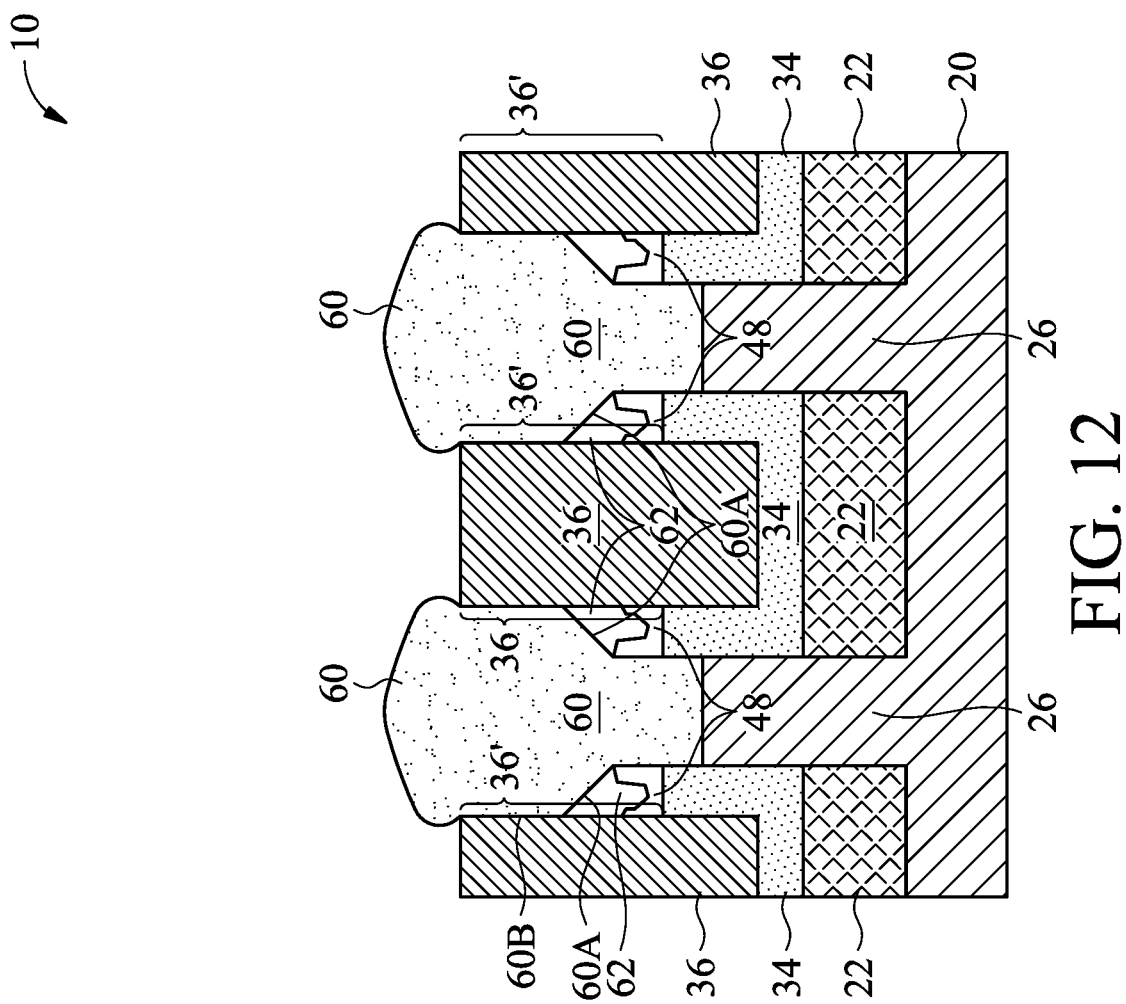
Figure 13:
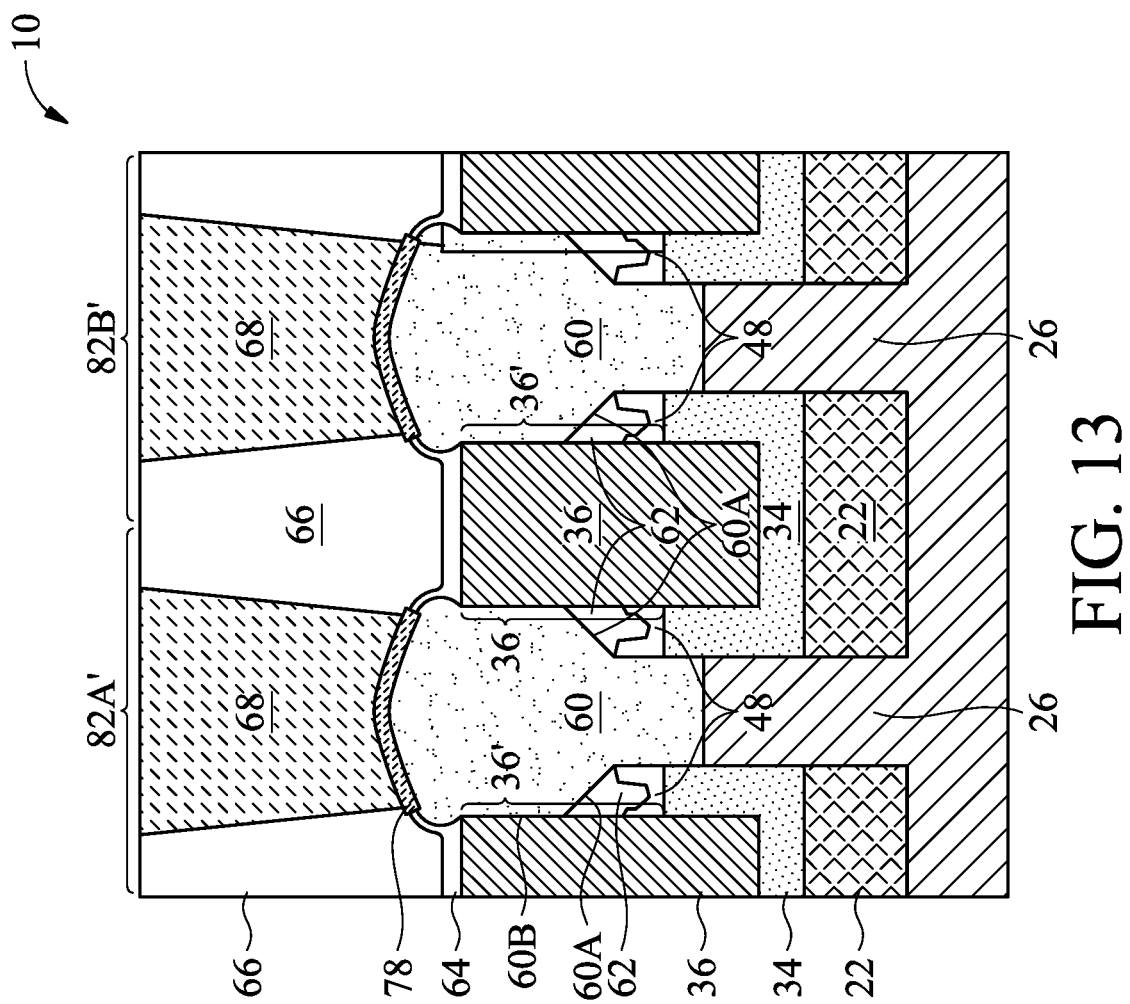

FIGS. 11 through 13 illustrate cross-sectional views of intermediate stages in the formation of FinFETs in accordance with alternative embodiments of the present disclosure. These embodiments are similar to what are discussed in preceding embodiments, except that epitaxy regions 60 are grown laterally beyond the confinement of protruding dielectric fins 36'. Unless specified otherwise, the materials and the formation processes of the components in these embodiments are essentially the same as the like components, which are denoted by like reference numerals in the embodiments shown in FIGS. 1-4, 5A, 5B, 6A, 6B, 7A, 7B, 7C, 8, 9, 10A and 10B. The details regarding the formation process and the materials of the components shown in FIGS. 11 through 13 may thus be found in the discussion of the embodiment shown in FIGS. 1-4, 5A, 5B, 6A, 6B, 7A, 7B, 7C, 8, 9, 10A and 10B.

The initial steps of these embodiments are essentially the same as shown in FIGS. 1-4, 5A, 5B, 6A, 6B, 7A, 7B, 7C, and 8. Next, as shown in FIG. 11, epitaxy regions 60 are grown. The growth is continued after the epitaxy regions 60 are higher than the top surfaces of protruding dielectric fins 36', and hence epitaxy regions 60 are grown laterally again, with additional facets formed.

Next, as shown in FIG. 12, epitaxy regions 60 are etched, for example, in an isotropic etching process (such as a wet etching process or a dry etching process), so that the corners of epitaxy regions 60 are rounded, and the lateral sizes of epitaxy regions 60 are reduced without significantly reducing the volume of epitaxy regions 60. In the resulting structure, epitaxy regions 60 have some overhang portions overlapping the edge portions of protruding dielectric fins 36'. By allowing epitaxy regions 60 to grow higher, the volume of epitaxy regions 60 is increased, and hence the stress applied to the channel region of the respective FinFET(s) by epitaxy regions 60 is increased.

FIG. 13 illustrates the formation of silicide regions 78 and source/drain contact plugs 68. The process details are similar to what are discussed referring to FIG. 10A, and are not repeated herein.

Figure 14:
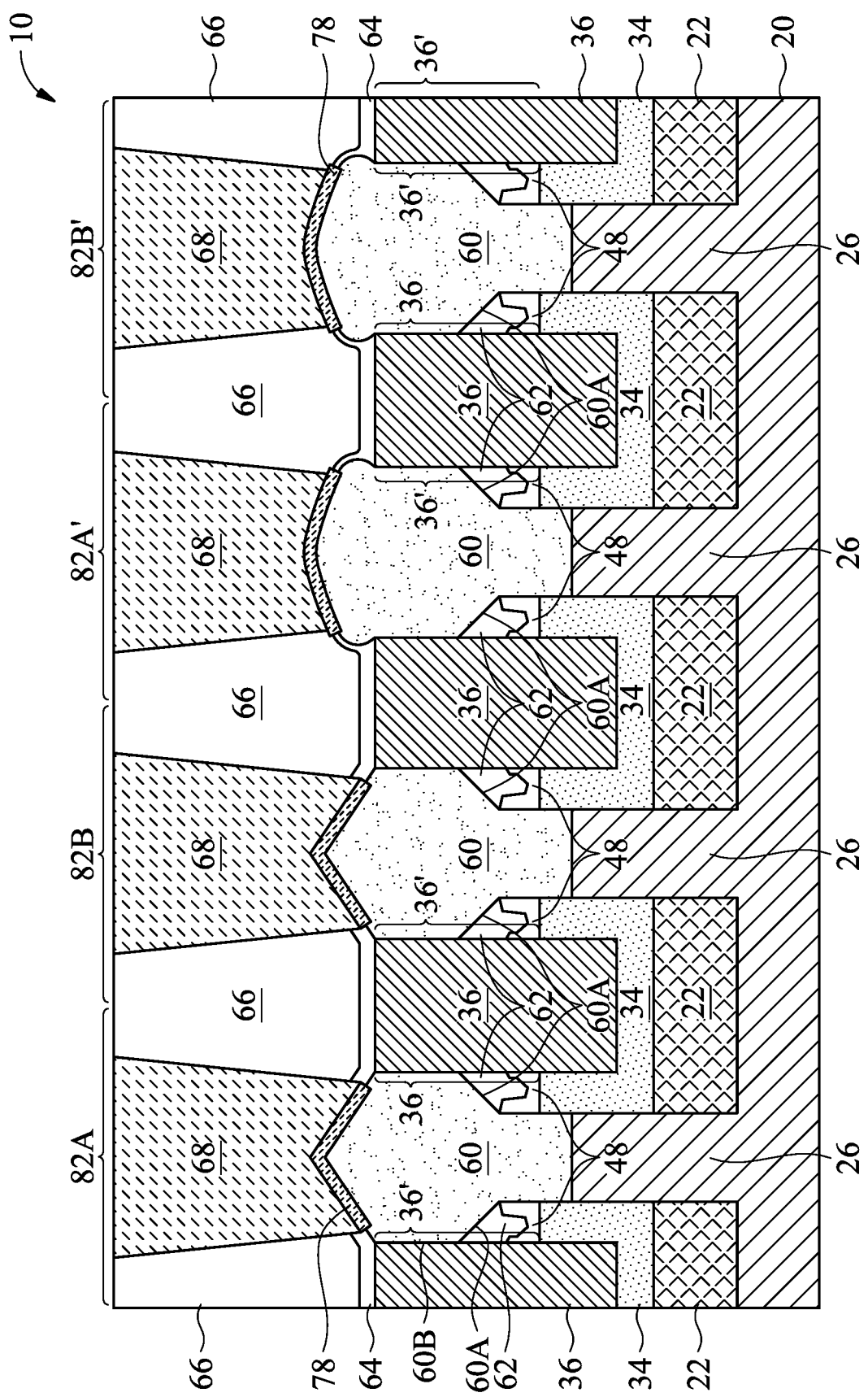
FIG. 14 illustrates the cross-sectional views of FinFETs having different source/drain design schemes in accordance with some embodiments.

FIG. 14 illustrates the formation of two types of FinFETs in the same die and on the same semiconductor substrate 20, with one of FinFETs being the same as shown in FIG. 10A, and the other being the same as shown in FIG. 13. FinFETs 82A, 82B, 82A', and 82B' may have different gate stacks. With the FinFETs having different epitaxy source/drain structures, the different requirements for different FinFETs may be served. For example, FinFETs 82A and 82B may be used in the circuits that need to be tightly packed, such as in Static Random Access Memory (SRAM) arrays. With the source/drain regions 60 of FinFETs 82A and 82B being fully confined by the protruding dielectric fins 36', neighboring epitaxy source/drain regions 60 do not have the risk of merging if not intended. On the other hand, FinFETs 82A' and 82B' may be used in the circuits that demand high drive currents such as computing circuits. With the source/drain regions 60 of FinFETs 82A' and 82B' having the increased volume, the currents of the FinFETs 82A' and 82B' are increased.

The embodiments of the present disclosure have some advantageous features. By forming protruding dielectric fins, the lateral growth of the epitaxy source/drain regions is confined, so that the epitaxy source/drain regions will not undesirably merge to cause device failure. The FinFETs thus may be formed close to each other.

In accordance with some embodiments of the present disclosure, a method includes forming isolation regions extending into a semiconductor substrate; recessing the isolation regions, wherein a semiconductor region between the isolation regions forms a semiconductor fin; forming a first dielectric layer on the isolation regions and the semiconductor fin; forming a second dielectric layer over the first dielectric layer; planarizing the second dielectric layer and the first dielectric layer; recessing the first dielectric layer, wherein a portion of the second dielectric layer protrudes higher than remaining portions of the first dielectric layer to form a protruding dielectric fin, and a portion of the semiconductor fin protrudes higher than the remaining portions of the first dielectric layer to form a protruding semiconductor fin; recessing a portion of the protruding semiconductor fin to form a recess; and epitaxially growing an epitaxy semiconductor region from the recess, wherein the epitaxy semiconductor region expands laterally to contact a sidewall of the protruding dielectric fin. In an embodiment, the recessing the first dielectric layer comprises etching the first dielectric layer, wherein when the first dielectric layer is etched, the second dielectric layer is exposed to a same etching chemical used for etching the first dielectric layer. In an embodiment, the method further includes forming a gate stack, wherein the protruding dielectric fin and the protruding semiconductor fin have a gap in between, and a gate electrode and a gate dielectric of the gate stack extend into the gap. In an embodiment, after the recessing the first dielectric layer, top surfaces of the protruding dielectric fin and the protruding semiconductor fin are coplanar with each other. In an embodiment, the first dielectric layer and an underlying portion of the isolation regions are in contact with each other, with a distinguishable interface therebetween. In an embodiment, the forming the isolation regions comprises FCVD, and the forming the first dielectric layer comprises ALD. In an embodiment, the first dielectric layer is formed using a conformal deposition method. In an embodiment, the method further includes forming a fin spacer on a sidewall of the protruding semiconductor fin, and wherein the epitaxy semiconductor region is laterally grown to overlap the fin spacer. In an embodiment, the epitaxy semiconductor region does not have any portion overlapping the protruding dielectric fin. In an embodiment, the epitaxy semiconductor region comprises a vertical edge contacting a vertical edge of the protruding dielectric fin to form a vertical interface, and the epitaxy semiconductor region is grown until a portion of the epitaxy semiconductor region overlaps the protruding dielectric fin.

In accordance with some embodiments of the present disclosure, a method includes forming a dielectric region between a first semiconductor fin and a second semiconductor fin, wherein the dielectric region comprises a first dielectric layer comprising a bottom portion and sidewall portions over and connected to opposite ends of the bottom portion; and a second dielectric layer between the sidewall portions of the first dielectric layer; recessing the sidewall portions of the first dielectric layer; recessing the first semiconductor fin and the second semiconductor fin to form a first recess and a second recess, respectively; and epitaxially growing a first epitaxy semiconductor region and a second epitaxy semiconductor region from the first recess and the second recess. In an embodiment, portions of the first semiconductor fin and the second semiconductor fin higher than top surfaces of remaining portions of the sidewall portions of the first dielectric layer form a first and a second protruding semiconductor fin, respectively. In an embodiment, the first epitaxy semiconductor region and the second epitaxy semiconductor region are laterally limited in growth by the second dielectric layer. In an embodiment, the first epitaxy semiconductor region forms a vertical interface with the second dielectric layer. In an embodiment, when the epitaxially growing is finished, the first epitaxy semiconductor region does not have any portion overlapping the second dielectric layer.

In accordance with some embodiments of the present disclosure, an integrated circuit device includes a semiconductor substrate; isolation regions extending into the semiconductor substrate; a semiconductor region between opposite portions of the isolation regions; a first dielectric fin and a second dielectric fin on opposite sides of the semiconductor region; and an epitaxy region over and contacting the semiconductor region, wherein the epitaxy region extends laterally beyond edges of the semiconductor region to contact the first dielectric fin and the second dielectric fin. In an embodiment, the epitaxy region forms vertical interfaces with the first dielectric fin and the second dielectric fin. In an embodiment, an entirety of the epitaxy region is in a region between the first dielectric fin and the second dielectric fin. In an embodiment, a portion of the epitaxy region overlaps the first dielectric fin. In an embodiment, the integrated circuit device further includes an air gap between the epitaxy region and the first dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a semiconductor substrate;
   isolation regions over a bulk portion of the semiconductor substrate;
   a semiconductor strip between opposite portions of the isolation regions;
   a first dielectric fin and a second dielectric fin on opposite sides of the semiconductor strip, wherein the first dielectric fin and the second dielectric fin overlap, and are physically joined to, a first isolation region and a second isolation, respectively, of the isolation regions;
   a semiconductor region over and contacting the semiconductor strip, wherein the semiconductor region extends laterally beyond edges of the semiconductor strip to contact the first dielectric fin and the second dielectric fin; and
   an air gap between the semiconductor region and the first dielectric fin.

2. The integrated circuit device of claim 1, wherein the semiconductor region forms vertical interfaces with the first dielectric fin and the second dielectric fin.

3. The integrated circuit device of claim 1 further comprising:
   a dielectric layer comprising a bottom portion overlapping one of the isolation regions; and a dielectric region overlapping the bottom portion of the dielectric layer, wherein the first dielectric fin comprises an upper portion of the dielectric region.

4. The integrated circuit device of claim 3, wherein the dielectric layer further comprises sidewall portions on sidewalls of a lower portion of the dielectric region.

5. The integrated circuit device of claim 1, wherein an entirety of the semiconductor region is in a region between the first dielectric fin and the second dielectric fin.

6. The integrated circuit device of claim 1, wherein a first vertical middle line of the first dielectric fin is vertically aligned to a second vertical middle line of the first isolation region, and the first vertical middle line is in middle of first opposing edges of the first dielectric fin, and the second vertical middle line is in middle of second opposing edges of the first isolation region.

7. The integrated circuit device of claim 1 further comprising a fin spacer directly underlying the air gap.

8. The integrated circuit device of claim 7, wherein a middle part of the fin spacer is vertically recessed more than edge parts of the fin spacer on opposite sides of the middle part.

9. The integrated circuit device of claim 1 further comprising:
a semiconductor fin connected to an end of the semiconductor region; and
a gate stack extending on first sidewalls and a top surface of the semiconductor fin, and extending on second sidewalls of the first dielectric fin and the second dielectric fin.

10. An integrated circuit device comprising:
a semiconductor substrate;
a shallow trench isolation region extending into the semiconductor substrate;
a dielectric layer over and contacting the shallow trench isolation region;
a first dielectric region comprising:
a first portion extending into the dielectric layer, wherein the first portion forms a first vertical interface with the dielectric layer; and
a second portion protruding higher than the dielectric layer; and
a semiconductor region contacting the second portion of the first dielectric region to form a second vertical interface, wherein a first part of the semiconductor region overlaps a part of the dielectric layer.

11. The integrated circuit device of claim 10 further comprising a semiconductor strip over and joined to the semiconductor substrate, wherein the semiconductor region further comprises a second part overlapping the semiconductor strip.

12. The integrated circuit device of claim 10 comprising a transistor, wherein the semiconductor region is a source/drain region of the transistor.

13. The integrated circuit device of claim 10 further comprising a second dielectric region on an opposite side of the semiconductor region than the first dielectric region, wherein the semiconductor region further contacts an additional sidewall of the second dielectric region.

14. The integrated circuit device of claim 10 further comprising an air gap between the semiconductor region and the second portion of the first dielectric region.

15. The integrated circuit device of claim 14, wherein a sidewall of the second portion of the first dielectric region is exposed to the air gap.

16. The integrated circuit device of claim 10 further comprising:
a fin spacer between the semiconductor region and the second portion of the first dielectric region;
a gate stack extending on the first dielectric region; and
a gate spacer on a sidewall of the gate stack, wherein the fin spacer and the gate spacer are formed of a same material.

17. An integrated circuit device comprising:
a semiconductor region comprising a first sidewall and a facet over and joined to the first sidewall;
a semiconductor fin connected to the semiconductor region;
a gate stack on the semiconductor fin;
a dielectric layer comprising a second sidewall contacting the first sidewall; and
a dielectric region comprising:
a first portion extending into the dielectric layer, wherein the first portion comprises first sidewalls opposing to each other, and wherein both of the first sidewalls are in contact with second sidewalls of the dielectric layer; and
a second portion protruding higher than the dielectric layer, wherein the facet of the semiconductor region, a top surface of the dielectric layer, and a sidewall of the dielectric region enclose an air gap therein.

18. The integrated circuit device of claim 17 further comprising a shallow trench isolation region underlying and in physical contact with the dielectric layer, wherein the shallow trench isolation region further comprises third sidewalls vertically aligned to corresponding ones of fourth sidewalls of the dielectric layer.

19. The integrated circuit device of claim 17 further comprising a fin spacer underlying and exposed to the air gap.

20. The integrated circuit device of claim 10, wherein the first vertical interface and the second vertical interface are parts of a straight and continuous interface, and wherein the first vertical interface and the second vertical interface are separated from each other.

* * * * *